(12) United States Patent
Park et al.

(10) Patent No.: US 7,323,740 B2
(45) Date of Patent: Jan. 29, 2008

(54) SINGLE CHIP DATA PROCESSING DEVICE WITH EMBEDDED NONVOLATILE MEMORY AND METHOD THEREOF

(75) Inventors: Weon-Ho Park, Suwon-si (KR); Sang-Soo Kim, Suwon-si (KR); Hyun-Khe Yoo, Suwon-si (KR); Sung-Chul Park, Seoul (KR); Byoung-Ho Kim, Suwon-si (KR); Ju-Ri Kim, Seoul (KR); Seung-Beom Yoon, Suwon-si (KR); Jeong-Uk Han, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 171 days.

(21) Appl. No.: 10/870,166

(22) Filed: Jun. 18, 2004

(65) Prior Publication Data
US 2004/0256658 A1  Dec. 23, 2004

(30) Foreign Application Priority Data
Jun. 20, 2003  (KR) .................... 10-2003-0040087

(51) Int. Cl.
*H01L 29/788* (2006.01)

(52) U.S. Cl. .................. 257/316; 257/317; 257/319; 257/320; 257/321

(58) Field of Classification Search ........ 257/315–317, 257/319–321, 369, 371, 392, 500–501
See application file for complete search history.

(56) References Cited

U.S. PATENT DOCUMENTS
5,239,197 A * 8/1993 Yamamoto .................. 257/500
(Continued)

FOREIGN PATENT DOCUMENTS
JP        2003037250 A      2/2003

OTHER PUBLICATIONS
German Office Action dated Mar. 21, 2006.
(Continued)

*Primary Examiner*—Thien F Tran
(74) *Attorney, Agent, or Firm*—Harness, Dickey & Pierce, PLC

(57) ABSTRACT

A device is described comprising a substrate of a first conductivity type having a first dopant concentration, a first well formed in the substrate, a second well of the first conductivity type formed in the substrate and being deeper than the first well, the second well having a higher dopant concentration than the first dopant concentration, and a nonvolatile memory cell formed on the second well. A device is described comprising four wells of various conductivity types with a nonvolatile memory cell formed on the second well. A device is described comprising a plurality of wells for isolating transistors of a plurality of voltage ranges, wherein each one of the plurality of wells contains at least one transistor of a particular voltage range, and wherein transistors of only one of the plurality of voltage ranges are within each of the plurality of wells. A method is described of isolating transistors of a first voltage range from transistors of another voltage range, comprising forming a first well to hold transistors only of a first particular voltage range, and forming a second well to hold transistors only of a second particular voltage range.

37 Claims, 32 Drawing Sheets

U.S. PATENT DOCUMENTS

| | | | |
|---|---|---|---|
| 5,276,646 A * | 1/1994 | Kim et al. | 365/189.09 |
| 5,541,125 A * | 7/1996 | Williams et al. | 438/202 |
| 5,907,171 A | 5/1999 | Santin et al. | |
| 6,055,655 A | 4/2000 | Momohara | |
| 6,165,847 A * | 12/2000 | Kanamori | 438/266 |
| 6,174,759 B1 | 1/2001 | Verhaar et al. | |
| 6,297,094 B1 | 10/2001 | Matsubara et al. | |
| 6,420,769 B2 * | 7/2002 | Patelmo et al. | 257/500 |
| 6,717,204 B1 * | 4/2004 | Furuhata et al. | 257/316 |
| 2001/0004120 A1 * | 6/2001 | Colclaser et al. | 257/326 |
| 2001/0024861 A1 | 9/2001 | Patelmo et al. | |
| 2003/0103382 A1 | 6/2003 | Kobayashi | |

OTHER PUBLICATIONS

French Preliminary Search Report dated Feb. 26, 2007.

\* cited by examiner

US 7,323,740 B2

SINGLE CHIP DATA PROCESSING DEVICE WITH EMBEDDED NONVOLATILE MEMORY AND METHOD THEREOF

This application claims the benefit of priority of Korean Patent Application No. 2003-40087, filed on Jun. 20, 2003, in the Korean Intellectual Property Office, the disclosure of which is incorporated herein in its entirety by reference.

BACKGROUND OF THE INVENTION

1. Field of the Invention

The present invention relates generally to a data processing device, and more particularly, to a single chip data processing device with an embedded nonvolatile memory device and method thereof.

2. Description of the Related Art

A single chip data processing device, such as a system on chip (SOC) or a microcontroller unit (MCU), may comprise a processor, memory storage, and at least one of a plurality of peripheral devices. These peripheral devices may include a logic circuit, a voice and image processing circuit, and various interface circuits. The different elements comprising the single chip data processing device may contain a plurality of driving voltages.

For example, a conventional single chip data processing device manufactured by a super-0.35-μm CMOS process may include a high-voltage (15–20 V) driving PMOS transistor, an intermediate-voltage (4–6 V) driving PMOS transistor, and a low-voltage (1–3 V) driving PMOS transistor formed in an N-well, and a high-voltage driving NMOS transistor (15–20 V), an intermediate-voltage driving NMOS transistor (4–6 V), and a low-voltage driving NMOS transistor (1–3 V) formed in a P-well.

Further, a high-voltage driving NMOS transistor requiring a low threshold voltage $V_{TH}$ may be formed on a p-type substrate. Variation of the threshold voltage $V_{TH}$ may occur due at least to a body effect. The body effect may be overcome to a degree by having the transistors of a cell of an electrically erasable and programmable read-only memory (EEPROM), which is a nonvolatile memory device, formed on a low-concentration p-type substrate.

Decreasing the fabricated size of electronic devices has led to many gains in performance. For this reason, sub-0.18-μm CMOS processes have recently been proposed. However, since the transistors of the EEPROM cell are conventionally formed on the low-concentration p-type substrate, a reduction in the cell size may lead to a short channel effect. The short channel effect is the increase of a threshold voltage due to a decreased channel length. This rise in voltage may lead to a punch-through effect. The punch-through effect refers to a current too high for a transistor to block.

Further, the formation of the PMOS transistors containing various driving voltages are formed in the N-well, and the NMOS transistors which have various driving voltages are formed in the P-well. Therefore, each of the transistors may not exhibit optimal operating characteristics at the same time as another transistor with a different driving voltage in the same well.

SUMMARY OF THE INVENTION

An exemplary embodiment of the present invention is a device comprising a substrate with a first dopant concentration, a first well formed in the substrate, a second well formed in the substrate, and a nonvolatile memory cell formed on the second well.

Another exemplary embodiment of the present invention is a device comprising a substrate of a first conductivity type with a first dopant concentration, a first well of the first conductivity type formed in the substrate, a second well of the first conductivity type formed in the substrate, the second well being deeper than the first well and having a higher dopant concentration than the first dopant concentration, a third well of the second conductivity type that is opposite to the first conductivity type, a fourth well of the second conductivity type formed in the substrate and being shallower than the third well, and a nonvolatile memory cell formed on the second well.

Another exemplary embodiment of present invention is a device comprising a plurality of wells for isolating transistors of a plurality of voltage ranges, wherein each one of the plurality of wells contains at least one transistor of a particular voltage range, and wherein transistors of only one of the plurality of voltage ranges are with each of the plurality of wells.

Another exemplary embodiment of the present invention is a method of isolating transistors of a first voltage range from transistors of another voltage range, comprising forming a first well to hold transistors only of a first particular voltage range, and forming a second well to hold transistors only of a second particular voltage range.

BRIEF DESCRIPTION OF THE DRAWINGS

The above object and advantages of the present invention will become more apparent by describing in detail exemplary embodiments thereof with reference to the attached drawings in which.

DETAILED DESCRIPTION OF THE INVENTION

Figure 1:
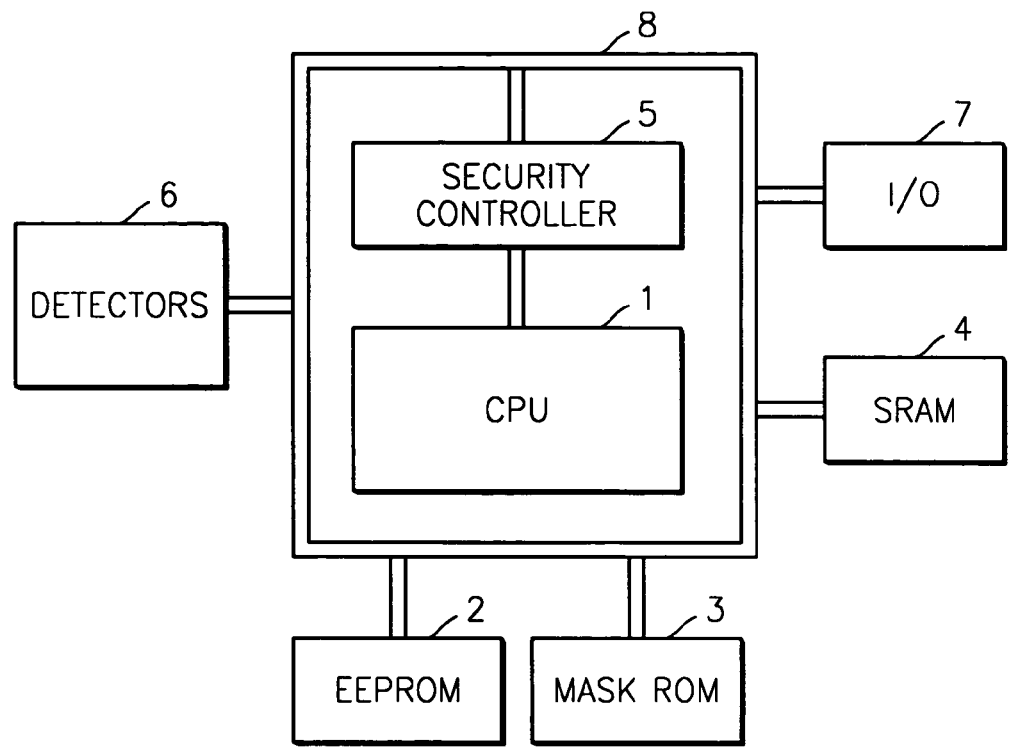
FIG. 1 is a block diagram of a single chip data processing device according to an embodiment of the present invention.

Hereinafter, exemplary embodiments of the present invention will be described in detail with reference to the accompanying drawings.

In the Figures, the thicknesses of layers may be exaggerated for clarity, and the same reference numerals are used to denote the same elements throughout the drawings.

A single chip data processing device according to an embodiment of the present invention comprises a processor, a memory, and peripheral devices. The processor may contain a complex instruction set computing (CISC) CPU or a reduced instruction set computing (RISC) CPU. Alternatively, a digital signal processor (DSP) or a combination of a CPU and a DSP may be used as the processor.

The memory may comprise a volatile memory, for example an SRAM or DRAM, and/or a nonvolatile memory. Examples of nonvolatile memory may include a mask ROM, an EEPROM, and a flash memory.

The peripheral devices may include a detector, a counter, a timer, an input/output (I/O) device, and a controller. The peripheral devices may also include devices for particular purposes. Examples of these types of peripheral devices may include an LCD controller, a graphics controller, and a network controller.

The processor, the memory, and the peripheral devices may be organically connected to each other via an address bus, a data bus, and a control bus. This connection may enable efficient data storage, data reading, and data processing.

Hereinafter, a high-voltage driving transistor (hereinafter, an HV TR) refers to a transistor to which a driving voltage of 15 V to 20 V is applied, a low-voltage driving transistor (hereinafter, an LV TR) refers to a transistor to which a driving voltage of 3 V or less is applied, and an intermediate-voltage driving transistor (hereinafter, an MV TR) refers to a transistor to which an intermediate voltage (e.g., a driving voltage of 4 V–6 V) between driving voltages applied to the HV TR and LV TR is applied. However, it is obvious that detailed values of driving voltage can be easily changed by those skilled in the art, and the voltage ranges described above may be altered while remaining within the scope of the present invention.

Hereinafter, a single chip data processing device manufactured by the sub-0.18-μm CMOS process will be described in detail.

FIG. 1 is a block diagram of a single chip data processing device according to an exemplary embodiment of the present invention. An example of the single chip data processing device shown in FIG. 1 may be a smart card media. A CPU 1 may be used as a processor, an EEPROM 2 and a mask ROM 3 may be used as nonvolatile memory devices, an SRAM 4 may be used as a volatile memory device, and a security controller 5, detectors 6 and an I/O 7 may be used as peripheral devices. These devices are connected to each other via a bus 8 so as to enable data storage, data reading, and data processing.

The CPU 1 may include an LV TR, and each memory cell of the EEPROM 2 may include a pair of transistors. A peripheral circuit, such as a column decoder and a row decoder of the EEPROM 2, may include an HV TR, and each of the mask ROM 3 and the SRAM 4 may include an LV TR. Further, each of the security controller 5, detectors 6, and I/O 7 may include both an MV TR and an LV TR. Therefore, the single chip data processing device may comprise a HV TR, a MV TR, and a LV TR.

Figure 2:
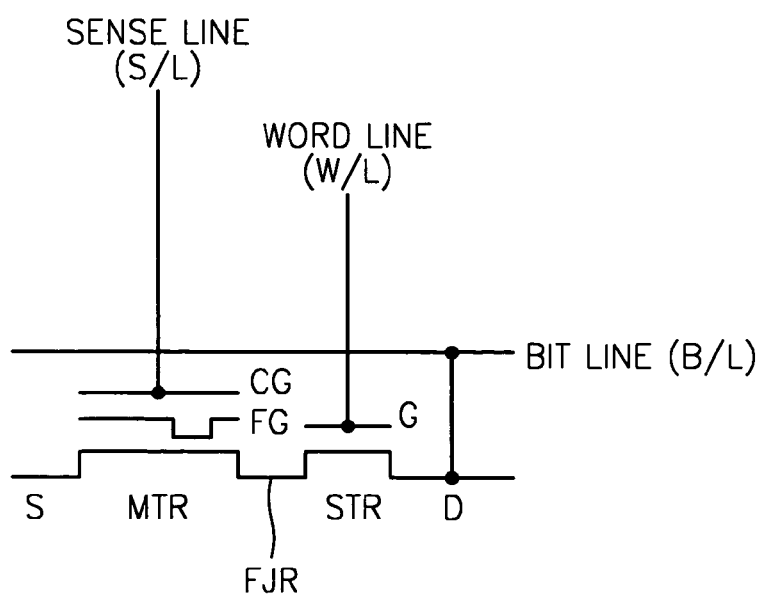
FIG. 2 is a diagram of an equivalent circuit of an EEPROM cell embedded in the single chip data processing device of FIG. 1.

FIG. 2 illustrates an equivalent circuit of the cell of the EEPROM 2 in the single chip data processing device according to an exemplary embodiment of the present invention.

Referring to FIG. 2, each memory cell of the EEPROM may include a memory transistor MTR and a selection transistor STR. The memory transistor MTR may be used to retain data as a logical "1" or "0" level. The selection transistor STR may be used to select memory bits. The memory transistor MTR may include a source region S, a floating junction region (FJR) which functions as a drain region, a floating gate FG, and a control gate CG. The selection transistor STR may include the floating junction region FJR which functions as a source region, a drain region D, and a gate G. A word line W/L may be connected to the gate G of the selection transistor STR, and a bit line B/L may be connected to the drain region D of the selection transistor STR. A sense line S/L may be connected to the control gate CG of the memory transistor MTR. The memory transistor MTR and the selection transistor STR may be connected to each other via the floating junction region FJR.

Figure 3:
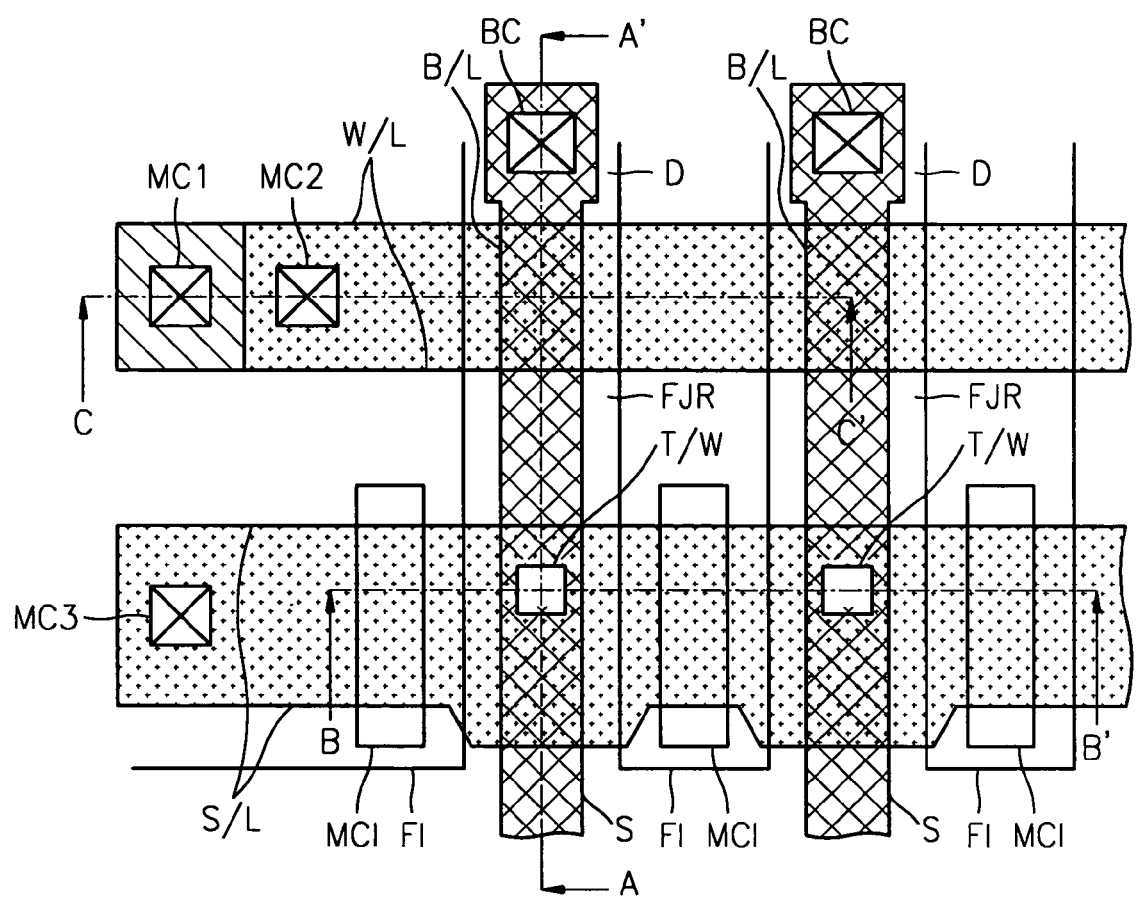
FIG. 3 illustrates a partial layout of an EEPROM cell array shown in FIG. 2.

FIG. 3 illustrates an exemplary embodiment of a partial layout of an EEPROM cell array shown in FIG. 2.

Referring to FIG. 3, an active region where transistors of the EEPROM cell may be formed may be defined by an isolation region FI. The sense line S/L may be disposed perpendicular to the isolation region FI. A word line W/L may be disposed parallel to the sense line S/L. The floating junction region FJR may be disposed between the sense line S/L and the word line W/L and in the active region under a tunneling window T/W. The source region S may be disposed in the active region on the opposite side of the floating junction region FJR based on the sense line S/L. The drain region D may be disposed in the active region on the opposite side of the floating junction region FJR based on the word line W/L. A bit line contact hole BC, which may be connected to a bit line B/L, may be disposed within the drain region D. The word line W/L may be connected to an upper interconnection via first and second contact holes MC1 and MC2, and the sense line S/L is connected to the upper interconnection via a third contact hole MC3. A mask pattern MCI may be used for separating memory cells.

Figure 4:
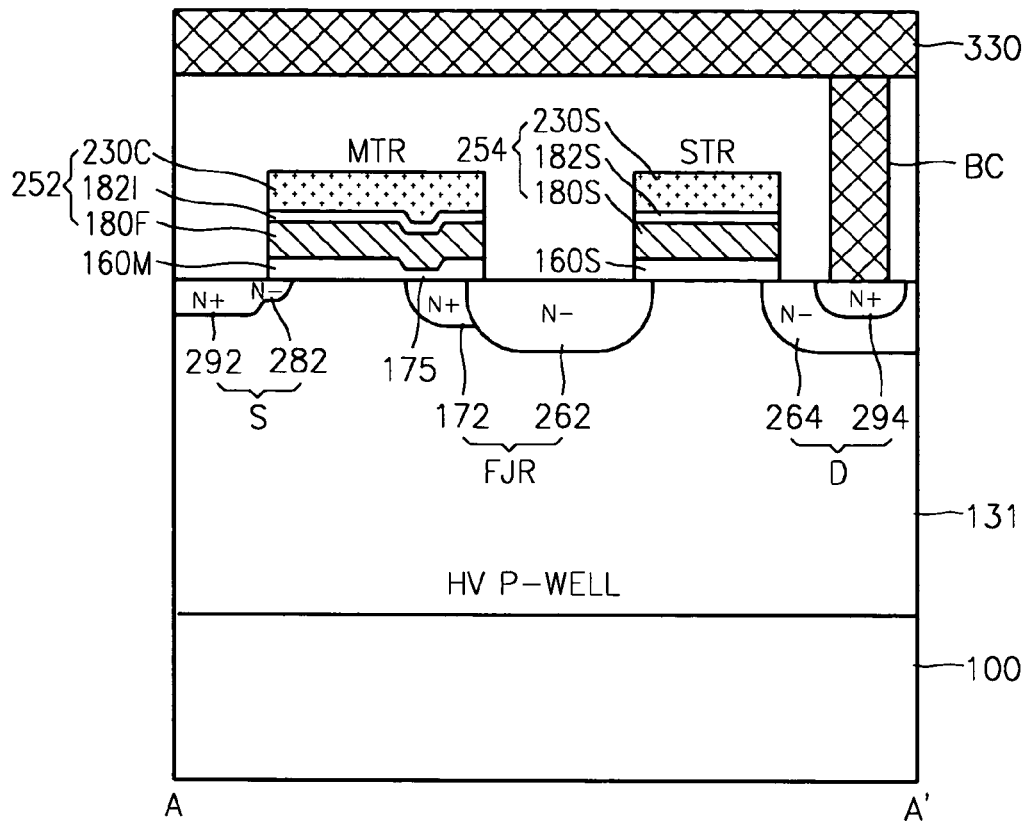
FIGS. 4 through 6 are cross-sectional views taken along lines A–A', B–B', and C–C' of FIG. 3, respectively.
Figure 5:
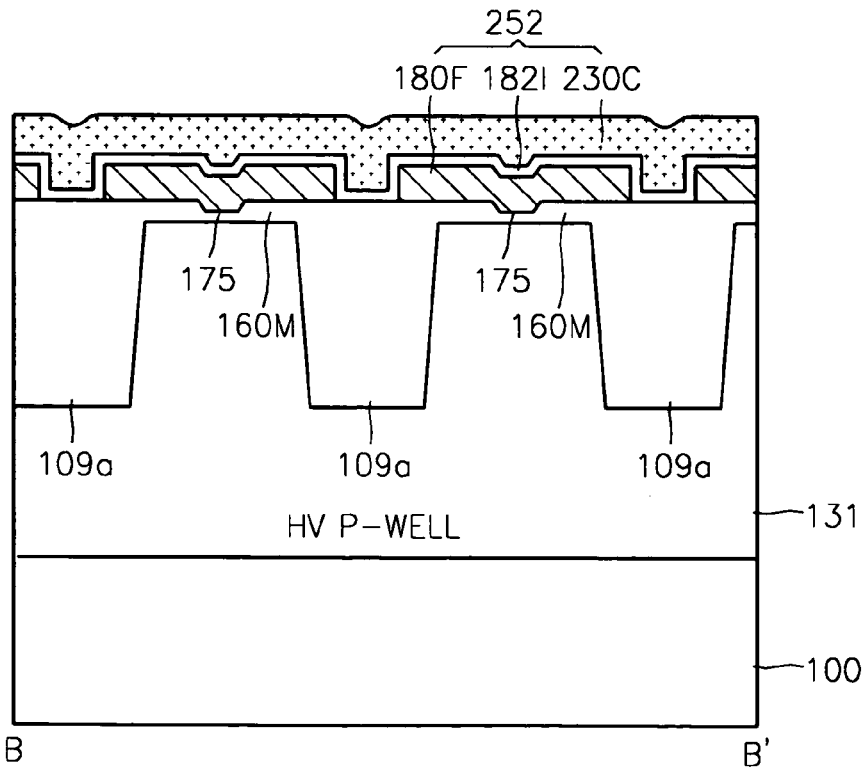
Figure 6:
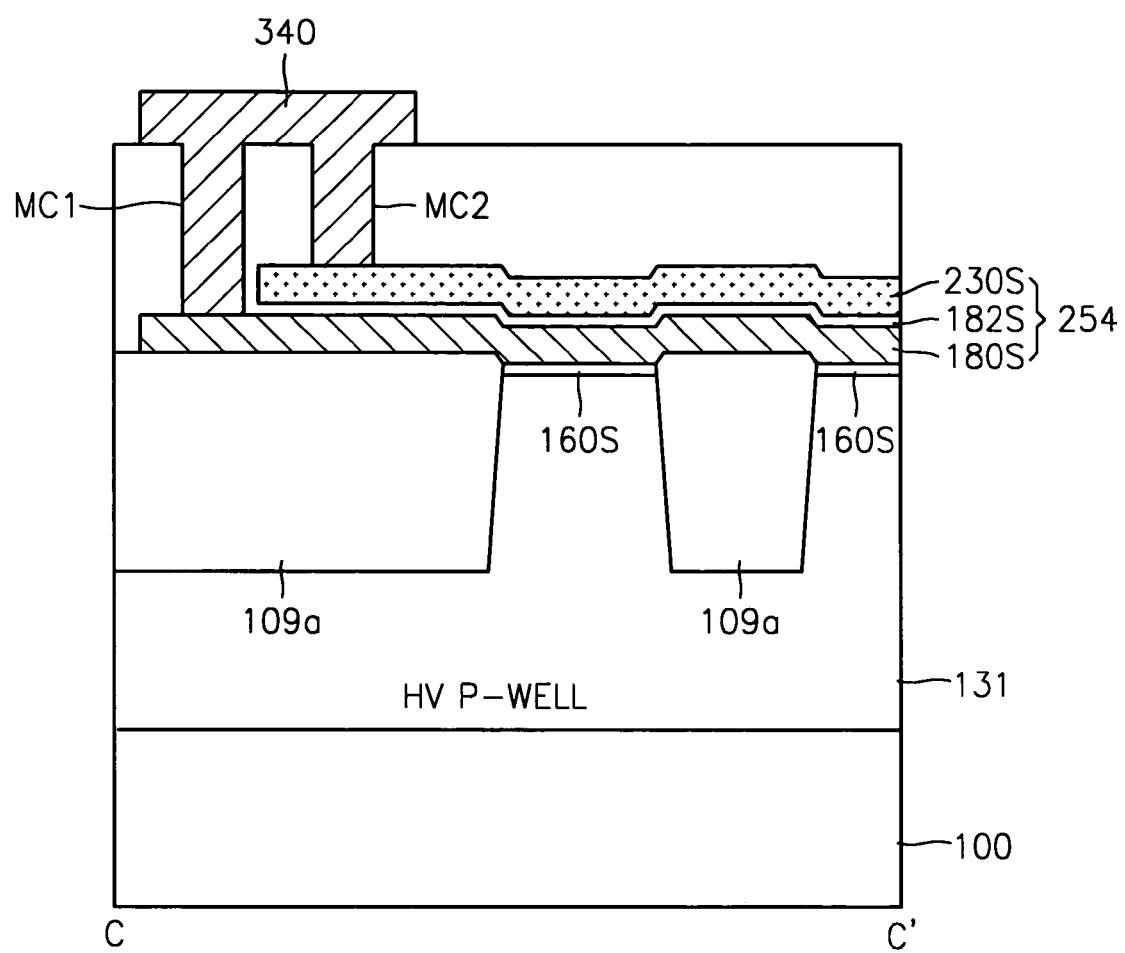

FIGS. 4 through 6 are cross-sectional views taken along lines A–A', B–B', and C–C' of FIG. 3, respectively.

Referring to FIGS. 4 through 6, in the single chip data processing device of the present invention, transistors of the EEPROM cell may be disposed on an HV P-well 131 formed on a p-type substrate 100. In particular, the memory transistor MTR and the selection transistor STR may be spaced apart from each other by an active region defined by a shallow trench isolation (STI) region 109a. The average dopant concentration of the HV P-well 131 may be higher than that of the p-type substrate 100. Also, since a high voltage may be applied to the memory transistor MTR and the selection transistor STR, the depth of the HV P-well 131 may be larger than that of a well (141 of FIG. 7) where LV TRs may be formed.

The memory transistor MTR may comprise a tunneling oxide layer 175 formed on the HV P-well 131, a memory gate oxide layer 160M, and a stack gate 252. The memory transistor MTR may further comprise the source region S and the floating junction region FJR, which may be formed in the HV P-well 131 on both sides of the stack gate 252.

The tunneling oxide layer 175 may be formed beneath the tunneling window T/W shown in FIG. 3 to a sufficient thickness for Flowler-Nordheim (F-N) tunneling during programming or erasing of a memory cell. The tunneling oxide layer 175 may be formed to a thickness of about 70 Å to 90 Å, and the memory gate oxide layer 160M may be formed to a thickness of about 200 Å to 400 Å.

The stack gate 252 may comprise a floating gate 180F, an inter-gate insulating layer 182I, and a control gate 230C. The inter-gate insulating layer 182I may be formed of oxide-nitride-oxide (ONO). The selection transistor STR may comprise a selection gate oxide layer 160S formed on the HV P-well 131, and a pseudo stack gate 254. The selection transistor STR may further comprise the drain region D and the floating junction region FJR, which may be formed in the HV P-well 131 on both sides of the pseudo stack gate 254.

For simplicity in the manufacturing process, the pseudo stack gate 254 may include a gate 180S formed at the same time as the floating gate 180F, an insulating pattern 182S formed at the same time as the inter-gate insulating layer 182I, and a pseudo gate 230S formed at the same time as the control gate 230C.

Referring to FIG. 6, the gate 180S and the pseudo gate 230S may be connected to a common upper interconnection 340 via first and second contact holes MC1 and MC2. Thus, the equivalent circuit diagram of the EEPROM cell according to an exemplary embodiment of the present invention may be as shown in FIG. 2. A bit line 330 may be connected to the drain region D via the bit line contact hole BC. The gate of the selection transistor STR may include a one-layer gate formed at the same time as the control gate 230C.

In order to prevent punch-through, the source region S may be an LDD region including an n⁻-type impurity region 282 and an n⁺-type impurity region 292. In order to maximize the effect of tunneling and prevent punch-through in the drain region D, the floating junction region FJR may include an n⁺-type region 172 disposed under the tunneling oxide layer 175 and an n⁻-type region 262 disposed under the memory gate oxide layer 160M and the selection gate oxide layer 160S. The drain region D may be a mask island double diffused drain (MI-DDD), in which an n⁺-type impurity region 294 may be defined in an n⁻-type impurity region 264, to maintain a high breakdown voltage characteristic. The mask island may refer to the n⁺-type impurity region 294 defined by an ion implantation mask in a region.

In an exemplary embodiment of the present invention, the transistors of the EEPROM cell may be formed within the HV P-well 131, which may have a higher dopant concentration than that of the p-type substrate. Therefore, the punch-through may be prevented by raising the dopant concentration of a region where the transistors of the EEPROM cell may be formed. When the transistors of the EEPROM cell are formed in the HV P-well 131 with a high dopant concentration, the threshold voltage may increase due to a body effect so as to cause a voltage drop between the drain region D and the source region S. However, when a channel of the transistors is shortened, the body effect may be reduced to compensate for the voltage drop between the drain and/or source, which may improve the characteristics of the transistors of the EEPROM cell. As a result, the transistor of the EEPROM cell may be scaled down and the punch-through may be effectively suppressed following the reduction of the EEPROM cell.

Program, erase, and read operations of the EEPROM cell according to an exemplary embodiment of the present invention will now be described. In order to perform an erase operation, a voltage of about 15 V to 20 V may be applied to both the sense line S/L and the word line W/L, the bit line B/L may be grounded, the source region S may be floated or a voltage of 0 V may be applied to the source region S, and a voltage of 0 V may be applied to the substrate. Thus, electrons may be injected into a floating gate F/G such that the threshold voltage $V_{TH}$ of the memory transistor MTR may be increased to 3 V to 7 V. Also, when the EEPROM cell performs a program operation, the sense line S/L may be grounded, an erase voltage of 15 V to 20 V may be applied to each of the bit line B/L and the word line W/L, a voltage of 15 V may be applied to the substrate, and the source region S may be floated. Thus, electrons may be emitted from the floating gate F/G such that the threshold voltage $V_{TH}$ of the memory transistor MTR may be decreased to −4 V to 0 V. During a read operation, the source region S may be grounded, a voltage of 1.7 V may be applied to the sense line S/L, a voltage of 3.3 V may be applied to the word line W/L, and a voltage of 2.5 V may be applied to the bit line B/L. Thus, the EEPROM cell may perform a read operation by detecting whether or not a current flows through the memory transistor MTR.

Figure 7:
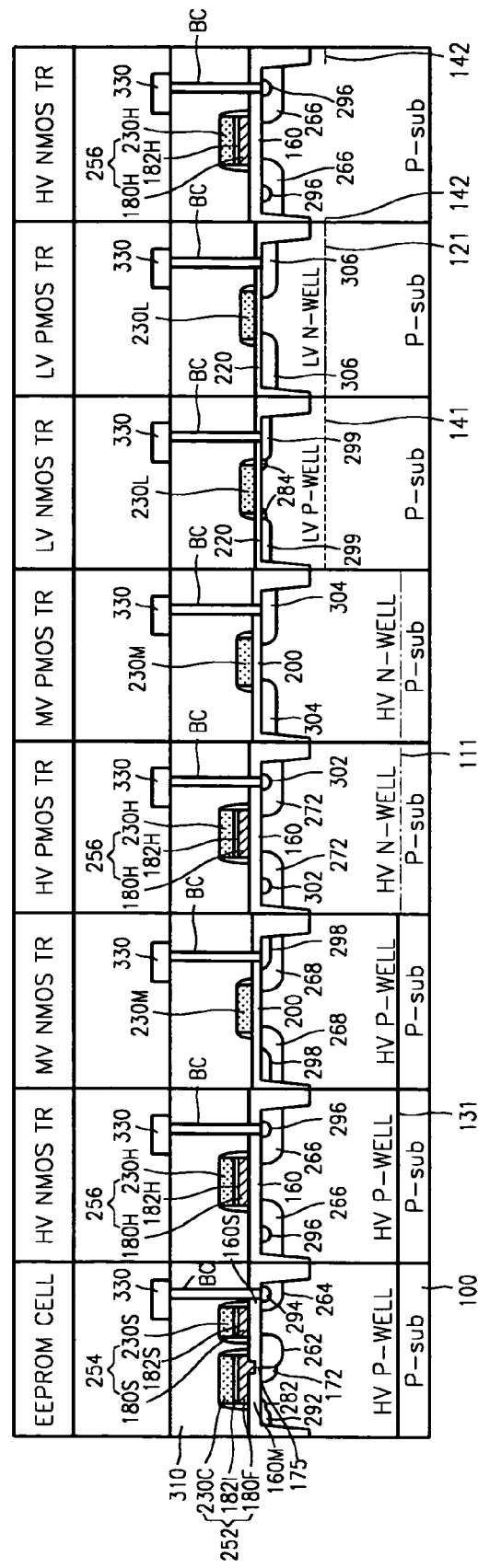
FIG. 7 is a cross-sectional view of the EEPROM cell and other transistors embedded in the single chip data processing device of FIG. 1.

FIG. 7 is a cross-sectional view of the EEPROM cell and other transistors embedded in the single chip data processing device according to an exemplary embodiment of the present invention.

Referring to FIG. 7, a quadruple well comprising four different wells may be formed on the p-type substrate 100. The quadruple well may comprise an LV P-well 141, an HV P-well 131, an LV N-well 121, and an HV N-well 111. The depths of the wells may affect the vertical punch-through voltage.

The HV P-well 131 may be formed to be deeper than the LV P-well 141, and the HV N-well 111 may be formed to be deeper than the LV N-well 121. The dopant concentration of the HV P-well 131 may be higher than that of the p-type substrate 100. The EEPROM cell, the HV NMOS TR, and MV NMOS TR may be formed on the HV P-well 131, the HV PMOS TR and the MV PMOS TR may be formed on the HV N-well 111, the LV NMOS TR may be formed on the LV P-well 141, the LV PMOS TR may be formed on the LV N-well 121, and a partial HV NMOS TR may be formed on the p-type substrate 100.

Gate oxide layers may be closely associated with a breakdown voltage characteristic. Accordingly, the an exemplary embodiment of the single chip data processing device of the present invention may comprise three different types of gate oxide layers. The single chip data processing device may comprise a gate oxide layer 160 for the HV TR, a gate oxide layer 200 for the MV TR, and a gate oxide layer 220 for the LV TR. Among these gate oxide layers, the gate oxide layer 160 for the HV TR may be the thickest, and the gate oxide layer 220 for the LV TR may be the thinnest. The gate oxide layer 160 for the HV TR may be 200 Å to 400 Å thick, the gate oxide layer 200 for the MV TR may be 100 Å to 200 Å thick, and the gate oxide layer 220 for the LV TR may be 20 Å to 40 Å thick. Further, both the memory gate oxide layer 160M and the selection gate oxide layer 160S of the transistor of the EEPROM cell may have the same thickness as the gate oxide layer 160 of the HV TR, and the tunneling oxide layer 175 may be 70 Å to 90 Å thick.

A gate of the HV TR may be a pseudo stack gate 256, which may comprise a gate 180H formed at the same time as the floating gate 180F of the EEPROM cell TR, an insulating pattern 182H formed at the same time as the inter-gate insulating layer 182I of the EEPROM cell TR, and a pseudo gate 230H formed at the same time as the control gate 230C of the EEPROM cell TR. The gate 180H and the pseudo gate 230H may be connected to the same upper interconnection and may be operated as a single gate similar to the gate 180S and the pseudo gate 230S of the selection transistor STR of the EEPROM cell.

In an exemplary embodiment of the present invention, the doping profile of the LV P-well 141 may be identical to that of a field isolation region 142 of the HV NMOS TR formed on the p-type substrate 100.

Hereinafter, the structure of each transistor TR will be described in more detail according to exemplary embodiments of the present invention.

In an exemplary embodiment of the present invention, the HV PMOS TR may be formed on the HV N-well 111 to ensure a high breakdown voltage characteristic and further may be formed with an MI-DDD structure having a p⁻-type region 272 and a p⁺-type region 302 disposed in the p⁻-type region 272.

Figure 8A:
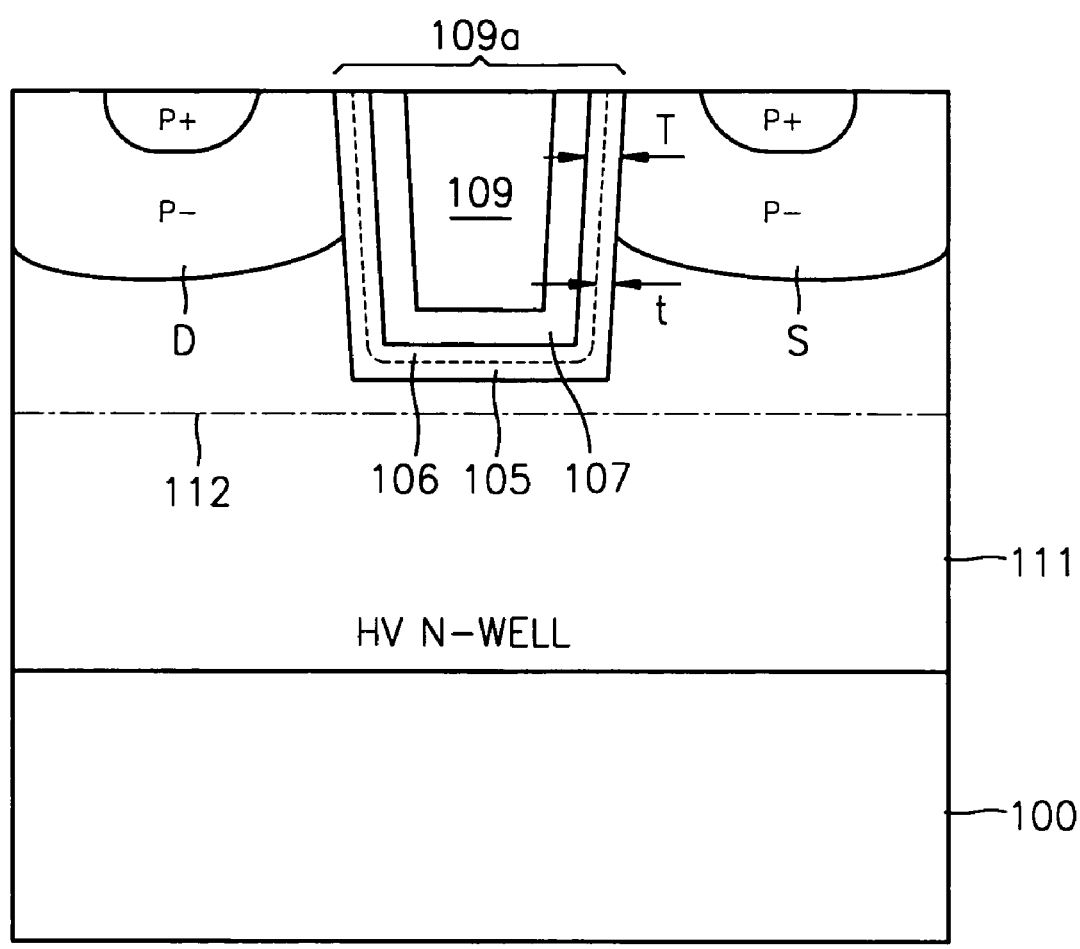
FIGS. 8A and 8B are enlarged cross-sectional views of a high-voltage PMOS transistor of FIG. 7.
Figure 8B:
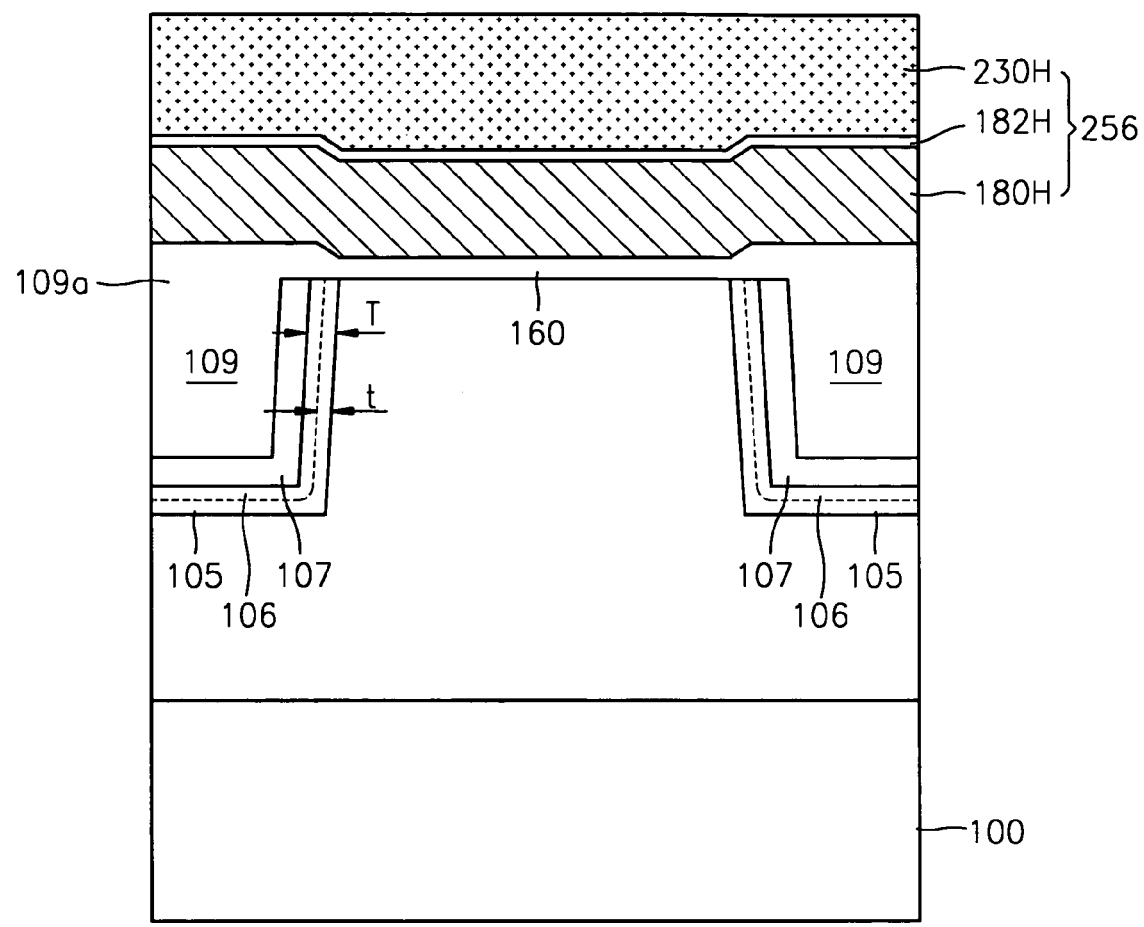

FIGS. 8A and 8B are enlarged cross-sectional views of the HV PMOS TR shown in FIG. 7. Referring to FIGS. 7, 8A, and 8B, the HV PMOS TR may comprise the gate oxide layer 160 formed on an active region defined by the STI region 109a, the gate 256 formed on the gate oxide layer 160, and the source and drain regions S and D formed in the HV N-well 111, on both sides of the gate 256. The gate oxide layer 160 of the HV PMOS TR may have the same thickness as each of the gate oxide layers 160M and 160S of the transistor of the EEPROM cell to ensure the high breakdown voltage characteristic.

The STI region 109a may comprise a trench 105, an oxide layer 106 for protecting the inner wall of the trench 105, a nitride layer 107 formed on the oxide layer 106 that prevents further oxidization of the oxide layer 106 and reinforces the insulating characteristic of the STI region 109a, and an insulating layer 109 which fills the trench 105.

In an exemplary embodiment of the present invention, if the oxide layer 106 is formed to the same thickness t (e.g., 100 Å) as an oxide layer (illustrated by a dotted line) included in a conventional STI, electrons e⁻ may be trapped in the nitride layer 107 when a voltage for driving a transistor is applied. Thus, holes h would accumulate at the bottom of the STI region 109a and cause inversion such that a parasitic field transistor may be formed due to a channel formed at the bottom of the STI region 109a. Alternatively, the holes h may accumulate on the sidewalls of the STI region 109a and may form a current path such that the threshold voltage $V_{TH}$ of the HV PMOS TR may be reduced to generate sub-threshold leakage current.

According to an exemplary embodiment of the present invention, a p-field isolation region 112 is formed under the STI region 109a in order to prevent the formation of a channel between the source region S and the drain region D of an adjacent HV PMOS TR. Also, the silicon oxide layer 106 formed on the sidewalls of the STI region 109a may have a sufficient thickness to create an electron trap barrier layer. The silicon oxide layer 106 may have a thickness T of 200 Å to 500 Å. Specifically, the silicon oxide layer 106 may have a thickness T of 250 Å.

Referring again to FIG. 7, in an exemplary embodiment of the present invention the MV PMOS TR may be formed on the HV N-well 111. If the MV PMOS TR is formed within the same N-well as the LV PMOS TR, a depletion region may expand into the drain region of the MV PMOS TR to which a higher voltage may be applied than the LV PMOS TR, thereby generating a drain leakage current which may deteriorate an Id-Vd characteristic. However, the MV PMOS TR may be formed on the HV N-well 111 such that leakage current may not generated in the drain region of the MV PMOS TR. Also, the LV PMOS TR may be formed on the LV N-well 121 to exhibit optimum operating characteristics. The MV PMOS TR may include a single source/drain region formed on a p⁺-type region 304.

In an exemplary embodiment, the MV PMOS TR may be formed on the HV P-well 131. If the MV PMOS TR, to which a higher voltage may be applied than the LV PMOS TR, may be formed within the same P-well as the LV NMOS TR, in view of the measurement result of acceleration lifetime evaluation (ALE), it would be difficult to ensure a hot carrier injection (HCI) characteristic at the MV NMOS TR. However, the MV NMOS TR may be separated from the LV NMOS TR and may be formed on the HV P-well 131, and the source/drain region may be formed to have a DDD structure instead of an LDD structure, in which an n⁻-type region 268 and an n⁺-type region 298 may be doubly diffused, which may facilitate a HCl characteristic.

In an exemplary embodiment, both the HV NMOS TR formed on the HV P-well 131 and the HV NMOS TR formed on the p-type substrate 100 may include the gate oxide layer 160, which may be thicker than the other transistors, and have an MI DDD structure, in which a source/drain region is formed of an n⁻-type region 266 and an n⁺-type region 296 defined in the n⁻-type region 266. This formation may exhibit a high breakdown voltage characteristic. The doping profile of the n-field isolation region 142 in the HV NMOS TR formed on the p-type substrate 100 may be identical to that of the LV P-well 141. The HV NMOS TR, which may be formed on the p-type substrate 100 without an interposed well, may be less affected by the body effect.

In an exemplary embodiment, the LV NMOS TR may be formed on the LV P-well 141, which may be shallower than the HV P-well 131 on which the TR of the EEPROM cell is formed. The LV NMOS TR may include the gate oxide layer 220, which may be thinner than the other transistors, and may be formed to have an LDD structure, in which a source/drain region may be formed of an n⁻-type region 284 and an n⁺-type region 299, which may exhibit a low-voltage driving characteristic.

In an exemplary embodiment, the LV PMOS TR may be formed on the LV N-well 121. The LV PMOS TR may include the gate oxide layer 220, which may be thinner than the other transistors, and a single source/drain region formed of a p⁺-type region 306, which may exhibit a low-voltage driving characteristic.

Although the EEPROM has been described as an example of a nonvolatile memory in an exemplary embodiment of the present invention, it would be obvious to one skilled in that art that other nonvolatile memories may also be used.

Hereinafter, a method of manufacturing a single chip data processing device according to exemplary embodiments of the present invention will be described with reference to FIGS. 9 through 33.

Figure 9:
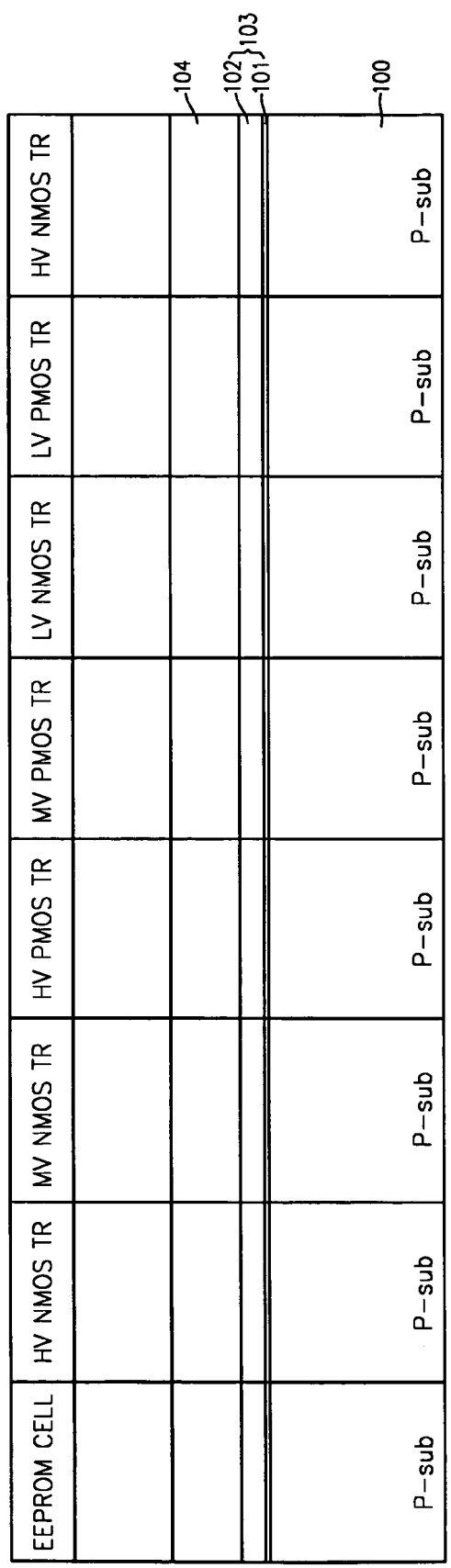
FIGS. 9–33 are cross-sectional views illustrating a method of manufacturing the single chip data processing device of FIG. 1.

Referring to FIG. 9, an oxide layer 101 and a nitride layer 102 may be formed on an integrated circuit p-type substrate 100, which may form a pad insulating layer 103. An organic anti-reflection coating (ARC), which is not shown in FIG. 9, and a photoresist 104 may be formed on the pad insulating layer 103. The oxide layer 101, which may reduce stress between the substrate 100 and the nitride layer 102, may be formed at a thickness of 100 Å. The nitride layer 102, which may be used as an etch mask during an etch process for forming an STI region, may be formed by depositing a silicon nitride layer to a thickness of 800 Å to 850 Å. The silicon nitride layer may be deposited by a known method, for example, chemical vapor deposition (CVD), sub-atmospheric CVD (SACVD), low-pressure CVD (LPCVD), or plasma enhanced CVD (PECVD).

Figure 10:
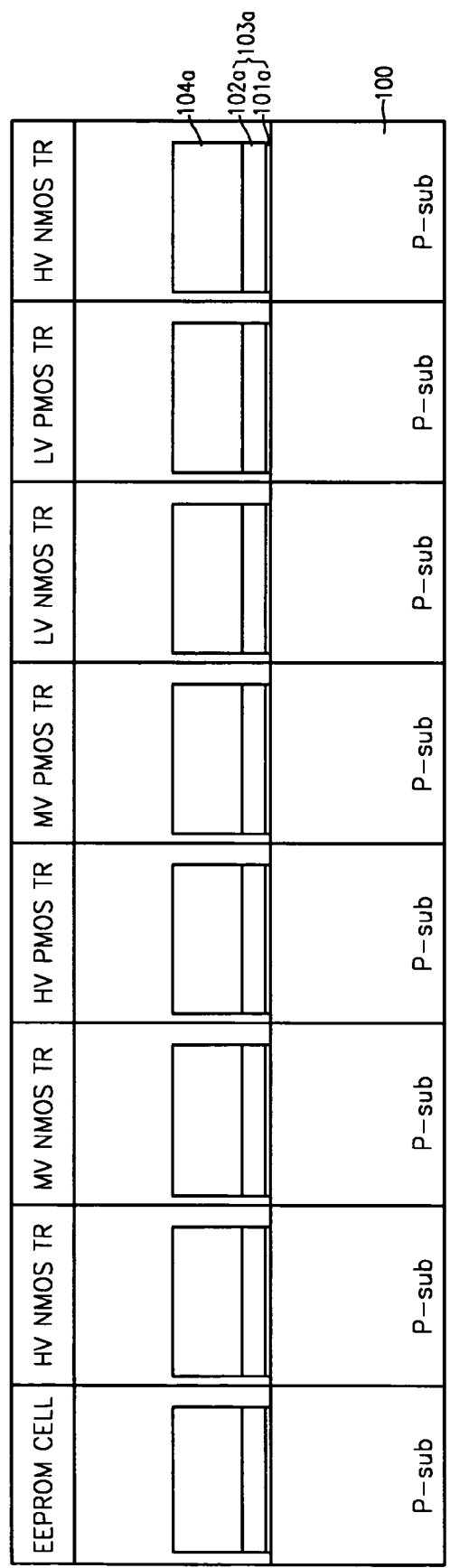

Referring to FIG. 10, a photoresist pattern 104a may be formed to define an active region. The pad insulating layer 103 may be patterned by a dry etch process using the photoresist pattern 104a as a mask. Thus, a pad mask 103a, which, au be formed of a nitride pattern 102a and an oxide pattern 101a, may be obtained. The nitride layer 102 may be etched using a gas of the carbon-fluorine group. An example of a gas which may be used is a $C_xF_y$-related gas or a $C_aH_bF_c$-related gas, such as $CF_4$, $CHF_3$, $C_2F_6$, $C_4F_8$, $CH_2F_2$, $CH_3F$, $CH_4$, $C_2H_2$, $C_4F_6$ and a mixture thereof. The nitride layer 102 may be etched with a gas comprising Ar.

Figure 11:
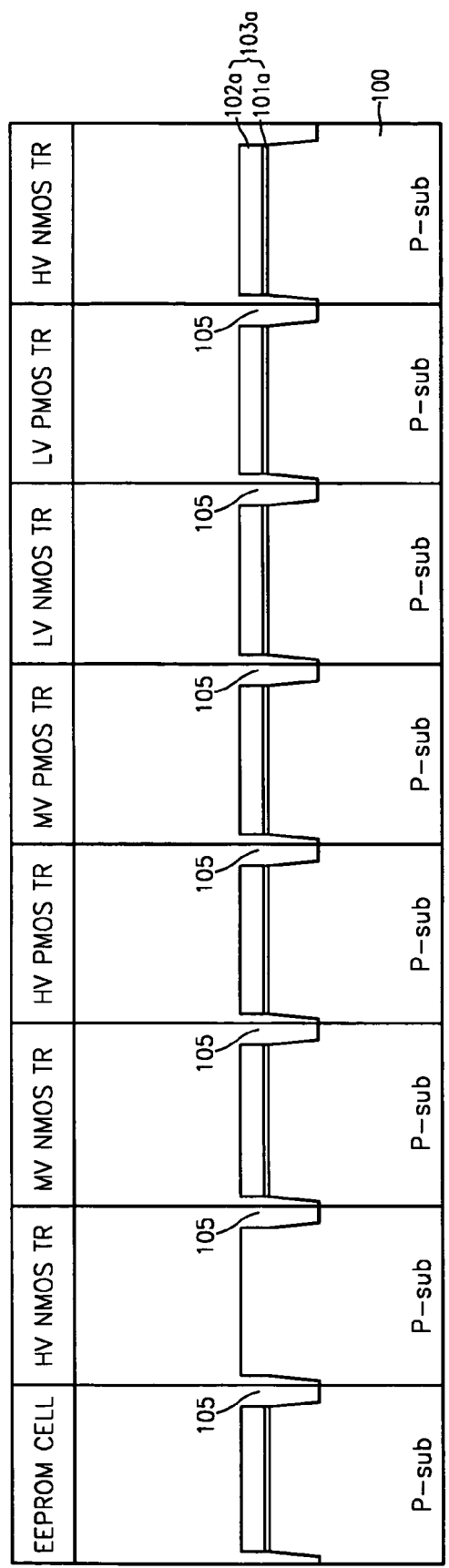

Referring to FIG. 11, the photoresist pattern 104a may be removed and the exposed p-type substrate 100 may be anisotropically dry etched using the pad mask 103a as an etch mask, which may form a trench 105 that defines the active region. The photoresist pattern 104a may be removed by a known method, for example, by ashing using $O_2$-plasma and an organic strip. The trench 105 may be formed at such an aspect ratio as not to generate voids in a subsequent process of filing the trench 105 with an insulating layer. For example, if the trench is filled with a high density plasma (HDP) oxide layer, the trench 105 may be formed with an aspect ratio of 3.0 or lower.

Figure 12:
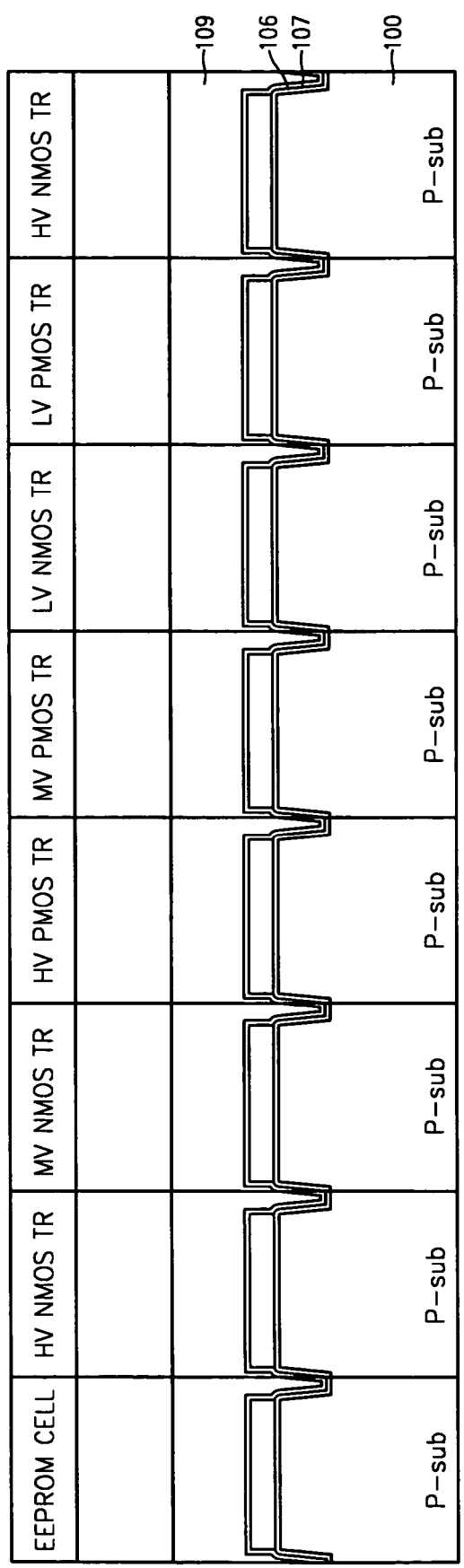

Referring to FIG. 12, a silicon oxide layer 106 may be formed on the entire surface of the resultant structure where the trench 105 may be formed to protect the inner walls of the trench 105. A nitride liner 107 may be formed on the silicon oxide layer 106 to prevent further oxidization of the silicon oxide layer 106 and may reinforce the insulating characteristic of the STI region. The silicon oxide layer 106 may be formed to such a thickness as to prevent trapping of electrons e⁻ in the nitride liner 107 during the operation of a transistor, including the HV PMOS TR. The silicon oxide layer 106 may be formed to a thickness of 200 Å to 500 Å and specifically may be formed to a thickness of 250 Å. The nitride liner 107 may be formed to a thickness of 50 Å to 300 Å.

The trench 105 may be filled with an insulating layer selected from the group comprising a USG layer, an HDP oxide layer, a TEOS layer formed using PECVD, an oxide layer formed using PECVD, and any combination thereof. Among them, the HDP oxide layer 109 may be used to fill in the trench 105. When an oxide layer is formed using an HDP CVD process, CVD may be combined with an etch process using sputtering. Further, $SiH_4$ and $O_2$ may be injected as deposition gases into a chamber, and an inert gas, such as Ar gas, may be injected as a sputtering gas into the chamber.

Figure 13:
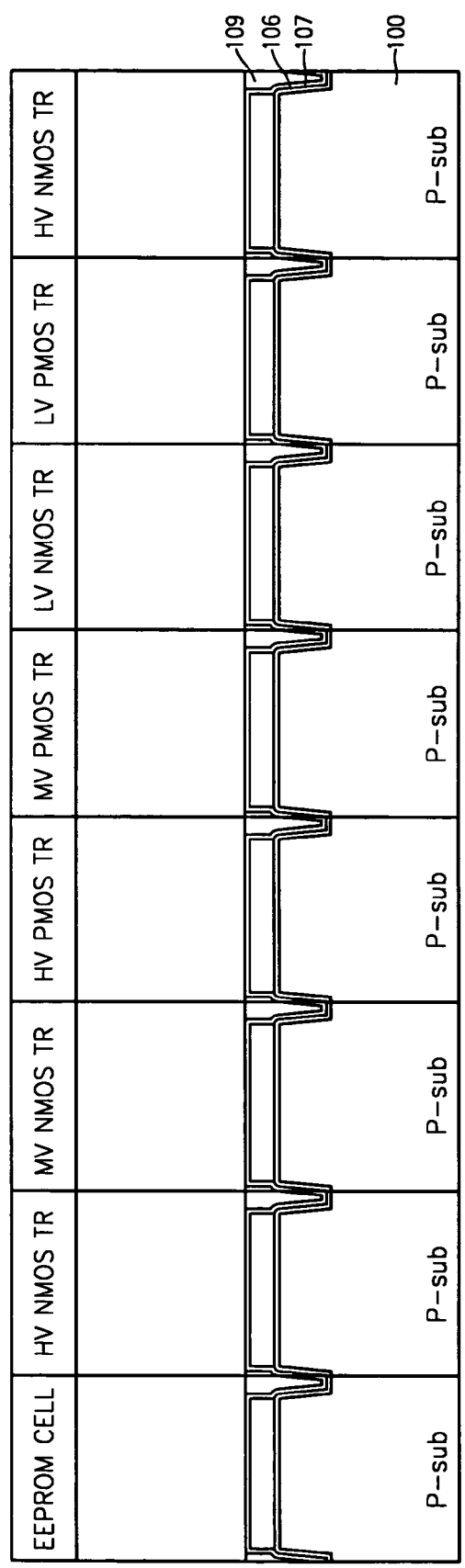

Referring to FIG. 13, the HDP oxide layer 109 may be planarized. For example, the HDP oxide layer 109 may be planarized using chemical mechanical polishing (CMP) or an etchback process.

Figure 14:
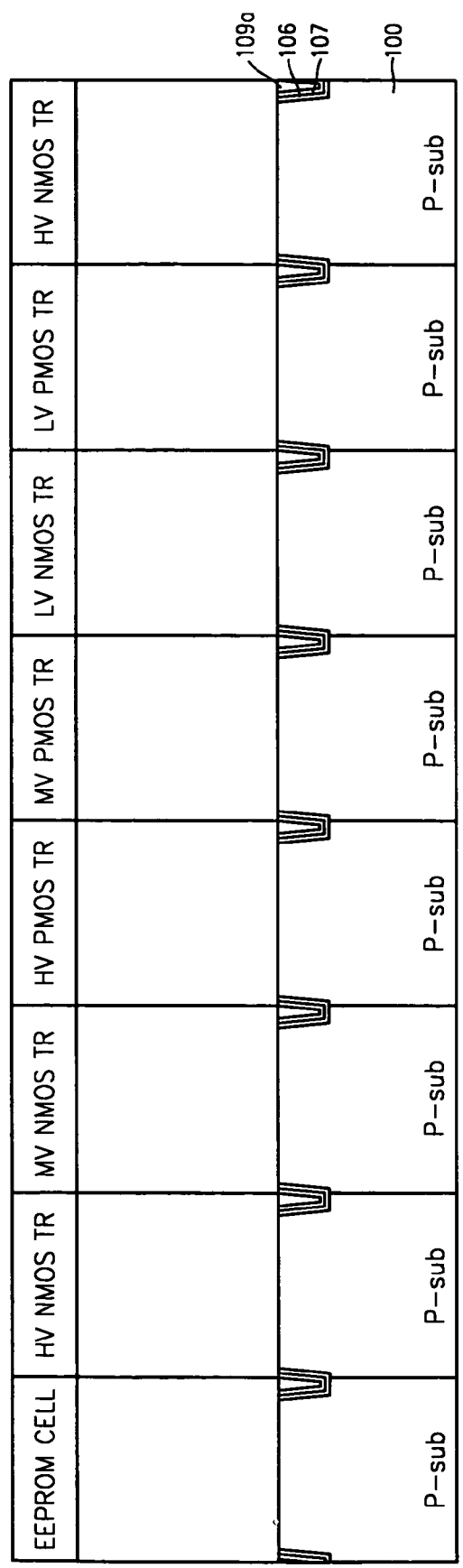

Referring to FIG. 14, an STI region 109a may be completed by removing the pad mask 103a. The nitride pattern 102a and the nitride liner 107, which may be included in the pad mask 103a, may be removed using a phosphoric acid ($H_3PO_4$) strip, and the oxide pattern 101a may be removed using HF or buffered oxide etchant (BOE).

In FIGS. 15 through 33, the STI region 109a will be schematically illustrated by the insulating layer 109 filled in the trench 105.

Figure 15:
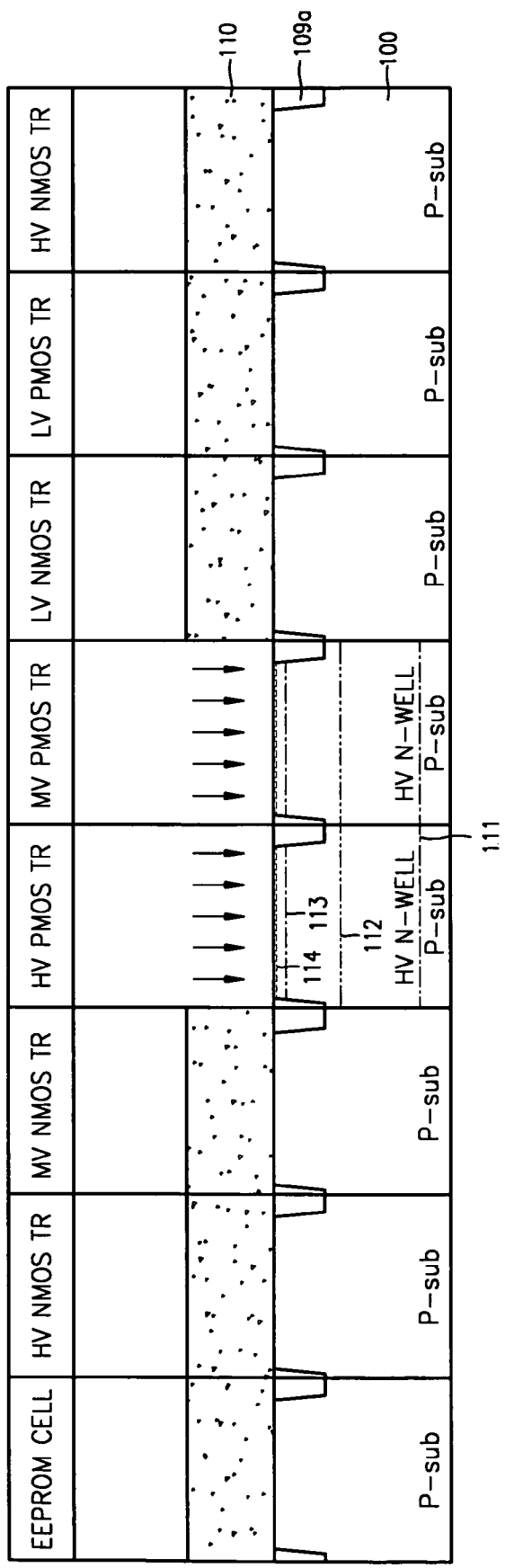

Referring to FIG. 15, a photoresist pattern 110 may be formed on the entire surface of the substrate 100, to define a region where an HV N-well may be formed. N-type impurity ions, for example, phosphorus ($p^+$) ions or arsenic ($As^+$) ions, may be implanted by using the photoresist pattern 110 as an ion implantation mask, which may form an HV N-well 111. Phosphorus ($p^+$) ions may be implanted at a dose of $1\times10^{13}$ to $5\times10^{13}$ atoms/cm² and at an energy of 1.3 MeV. Phosphorus ($p^+$) ions may be implanted at a lower dose and at a lower energy than when the HV N-well 111 may be formed, which may form a p-field isolation region 112.

The p-field isolation region 112 may be formed by implanting phosphorus ($p^+$) ions at a dose of $1\times10^{12}$ to $6\times10^{12}$ atoms/cm² and at an energy of 300 KeV. A counter ion implantation may be implemented to prevent lowering of the threshold voltage in the PMOS TR. Arsenic ($As^+$) ions may be implanted at a dose of $1\times10^{12}$ to $5\times10^{12}$ atoms/cm² and at an energy of 240 KeV, which may form a counter ion implantation region 113. P-type impurity ions, for example, boron ($B^+$) or boronic fluorine ($BF_2^+$) ions, may be implanted to control the threshold voltage $V_{THP}$. A $V_{THP}$ control region 114 may be formed by implanting boronic fluorine ($BF_2^+$) ions at a dose of $1\times10^{13}$ to $4\times10^{13}$ atoms/cm² and at an energy of 40 KeV.

Figure 16:
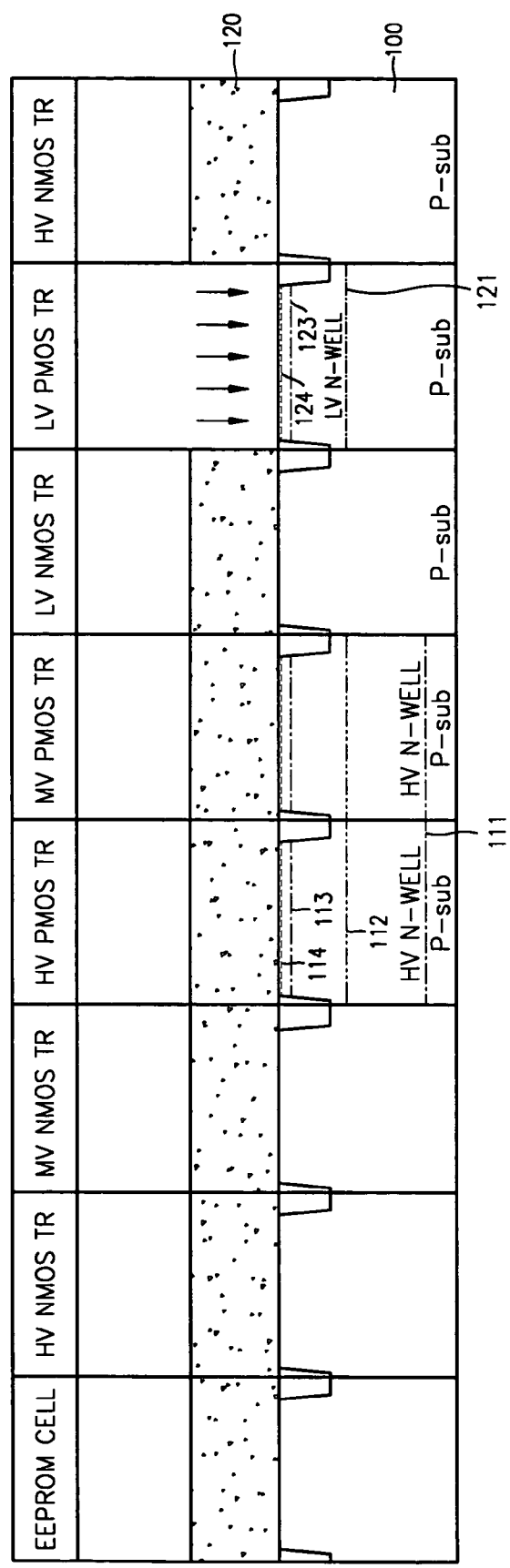

Referring to FIG. 16, the photoresist pattern 110 may be removed by ashing and using an organic strip, and a photoresist pattern 120 may be formed to define a region where an LV N-well will be formed. N-type impurity ions may be implanted by using the photoresist pattern 120 as an ion implantation mask, which may form an LV N-well 121. The LV N-well 121 may be formed to be more shallow than the HV N-well by implanting the n-type impurity ions at a lower energy than when the HV N-well 111 may be formed. The n-type impurity ions may be implanted at a dose of $1\times10^{13}$ to $5\times10^{13}$ atoms/cm² and at an energy of 360 KeV.

A counter ion implantation may be implemented to prevent lowering of the threshold voltage $V_{TH}$ in the PMOS transistor. A counter ion implantation region 123 may be formed by implanting arsenic ($As^+$) ions at a dose of $1\times10^{12}$ to $7\times10^{12}$ atoms/cm² and at an energy of 240 KeV. Impurity ions may be implanted to control the threshold voltage $V_{THP}$. A $V_{THP}$ control region 124 may be formed by implanting boronic fluorine ($BF_2^+$) ions at a dose of $1\times10^{13}$ to $7\times10^{13}$ atoms/cm² and at an energy of 40 KeV.

Figure 17:
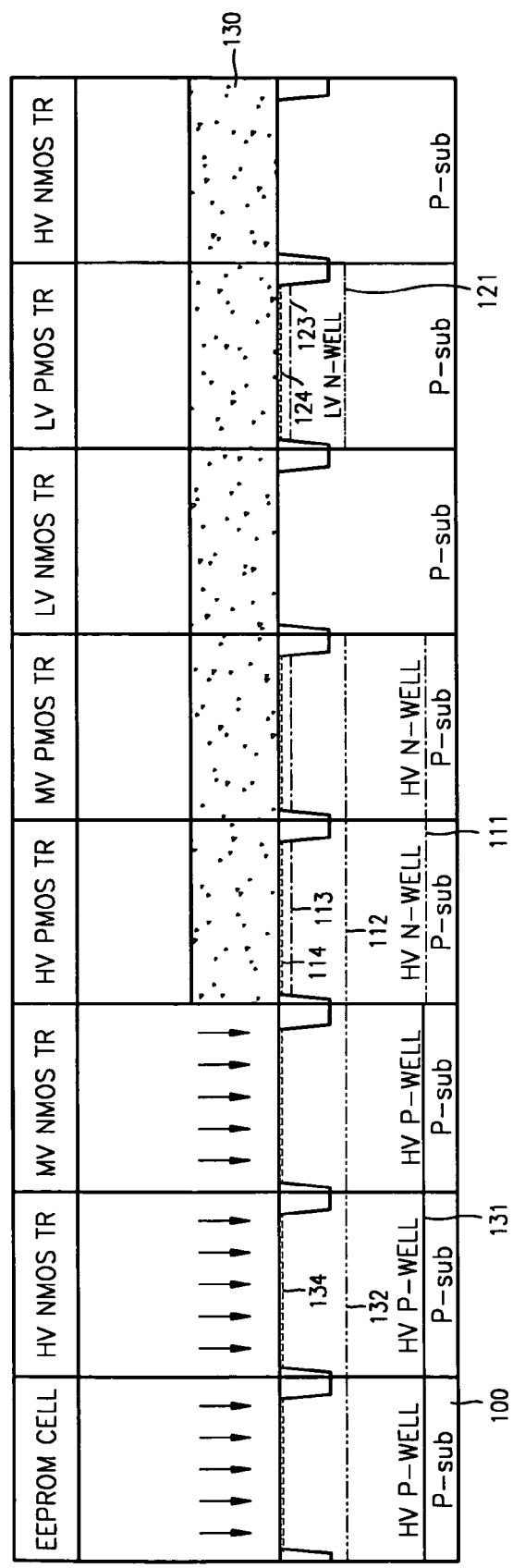

Referring to FIG. 17, the photoresist pattern 120 may be removed by ashing and using an organic strip, and a photoresist pattern 130 may be formed to define a region where an HV P-well may be formed. P-type impurity ions, which may include boron ($B^+$) or boronic fluorine ($BF_2^+$) ions, may be implanted by using the photoresist pattern 130 as an ion implantation mask, which may form an HV P-well 131. Boron ($B^+$) ions may be implanted at a dose of $1\times10^{13}$ to $3\times10^{13}$ atoms/cm² and at an energy of 700 KeV. P-type impurity ions may be implanted at a lower energy than when the HV P-well 131 is formed, which may form an n-field isolation region 132. The n-field isolation region 132 may be formed by implanting boron ($B^+$) ions at a dose of $1\times10^{13}$ to $3\times10^{13}$ atoms/cm² and at an energy of 130 KeV. Impurity ions may be implanted to control the threshold voltage $V_{THN}$. A $V_{THN}$ control region 134 may be formed by implanting boron ($B^+$) ions at a dose of $1\times10^{13}$ to $5\times10^{13}$ atoms/cm² and at an energy of 50 KeV.

Figure 18:
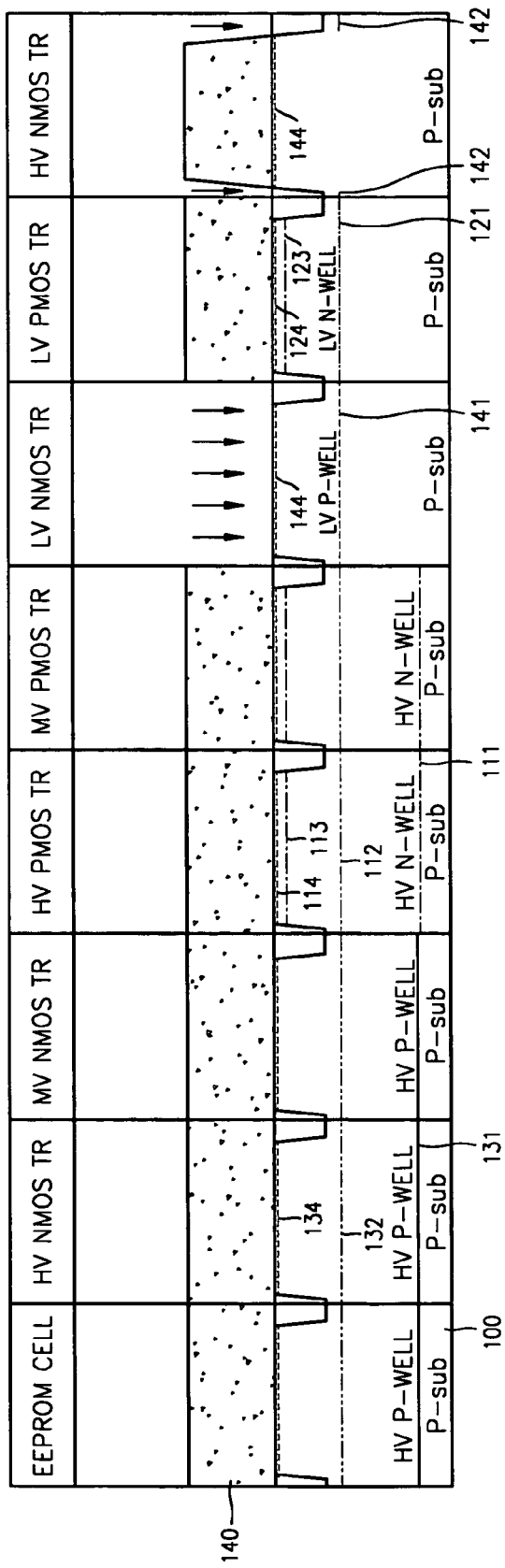

Referring to FIG. 18, the photoresist pattern 130 may be removed by ashing and using an organic strip, and then a photoresist pattern 140 may be formed to define a region where an LV P-well may be formed and a region where an HV NMOS TR may be formed on the p-type substrate. N-type impurity ions may be implanted by using the photoresist pattern 140 as an ion implantation mask at a lower energy than when the HV P-well 131 may be formed. Thus, an LV P-well 141 and an n-field isolation region 142 of the HV NMOS TR which may be formed in the p-type substrate may be formed to be more shallow than the HV P-well. Boron ($B^+$) ions may be implanted at a dose of $1\times10^{13}$ to $5\times10^{13}$ atoms/cm² and at an energy of 170 KeV. Impurity ions may be implanted to control the threshold voltage $V_{THN}$. A $V_{THN}$ control region 144 may be formed by implanting indium ($In^+$) ions at a dose of $1\times10^{12}$ to $7\times10^{12}$ atoms/cm² and at an energy of 180 KeV.

For simplicity, only the well regions 111, 121, 131, and 141 and the field isolation region 142 of the HV NMOS TR which may be formed on the p-type substrate will be illustrated in FIGS. 19 through 34. Other features of FIGS. 19 through 34 have been adequately described with respect to earlier figures.

Figure 19:
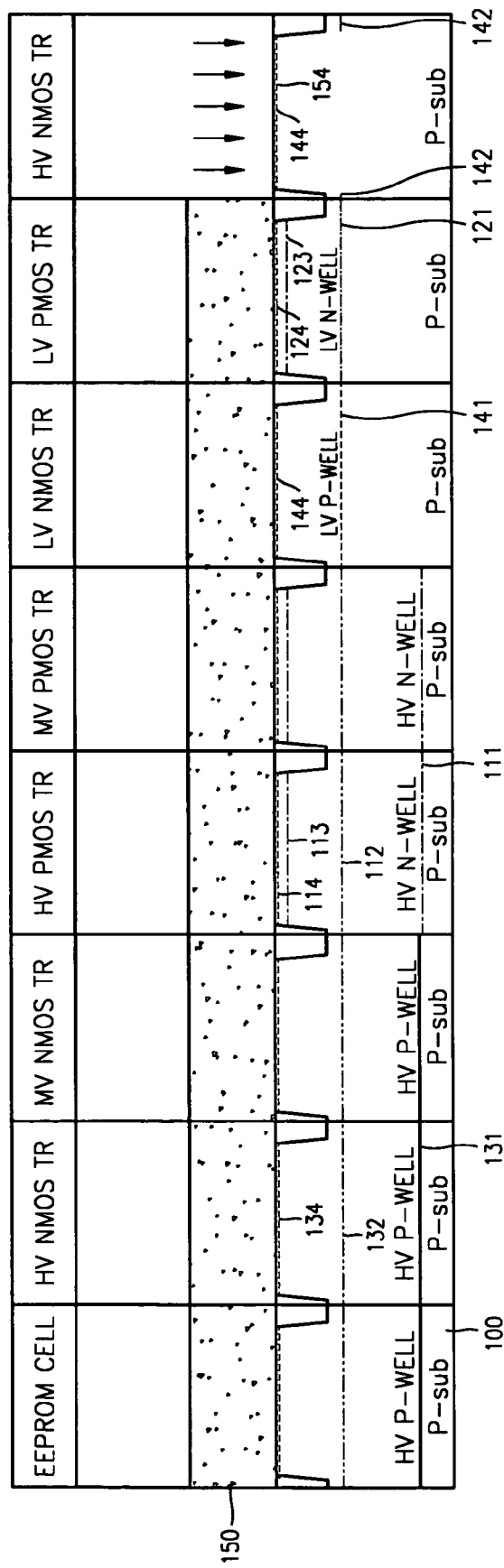

Referring to FIG. 19, the photoresist pattern 140 may be removed by ashing and using an organic strip, and a photoresist pattern 150 may be formed to define a region where an HV NMOS TR may be formed on the p-type substrate 100. Impurity ions may be implanted by the photoresist pattern 150 as an ion implantation mask, which may form a threshold voltage $V_{THN}$ control region 154 for the HV NMOS TR which may be formed on the p-type substrate 100.

Figure 20:
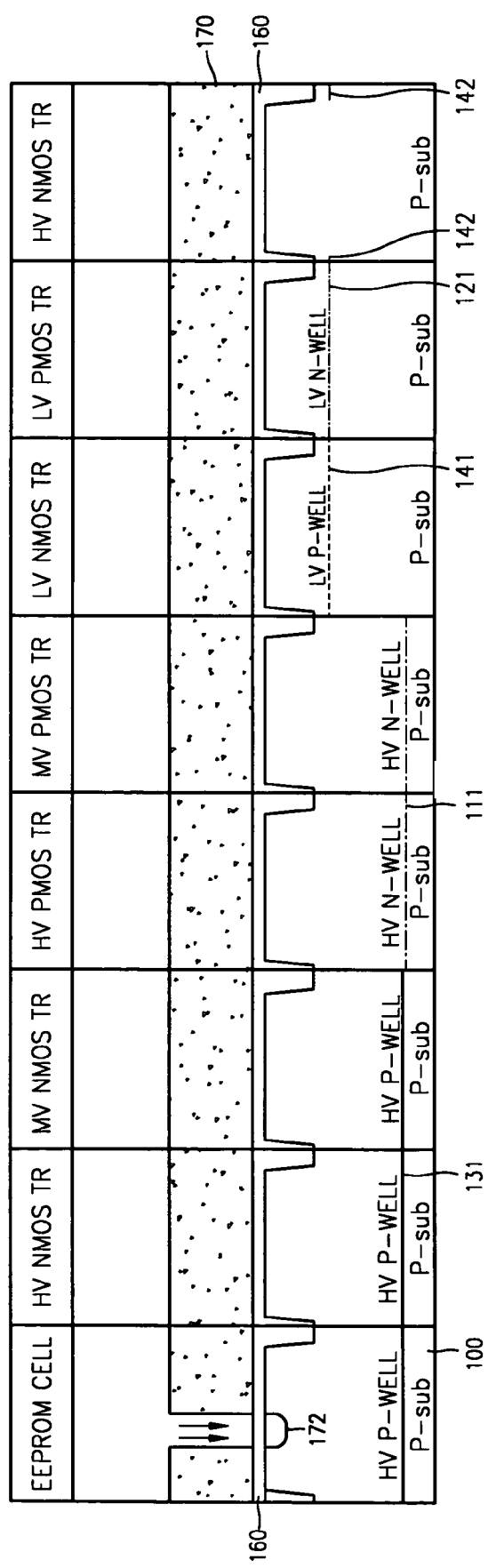

Referring to FIG. 20, the photoresist pattern 150 may be removed by ashing and using an organic strip, and a native oxide layer which may be formed on the entire surface of the substrate 100 may be removed using a wet cleaning process. A gate oxide layer 160 may be formed to a thickness of 200 Å to 400 Å. The gate oxide layer 160 may be formed by a method selected from dry oxidation using $O_2$ gas at a temperature of about 1000° C. Å to 1100° C. Å, wet oxidation in an atmosphere of water vapor at a temperature of 1000° C. Å to 1100° C. Å, HCl oxidation using a gas mixture of $O_2$ gas and HCl gas, oxidation using a gas mixture of $O_2$ gas and $C_2H_3Cl_3$ gas, and oxidation using a gas mixture of $O_2$ gas and $C_2H_2Cl_2$. A photoresist pattern 170 may be formed to expose a region where an $n^+$-type region may be formed under a tunneling oxide layer in a floating junction region of the EEPROM cell TR, and impurity ions may be implanted so as to form an $n^+$-type region 172. The $n^+$-type region 172 may be formed by implanting arsenic ($As^+$) ions at a dose of $1\times10^{13}$ to $9\times10^{13}$ atoms/cm$^2$ and at an energy of 100 KeV.

Figure 21:
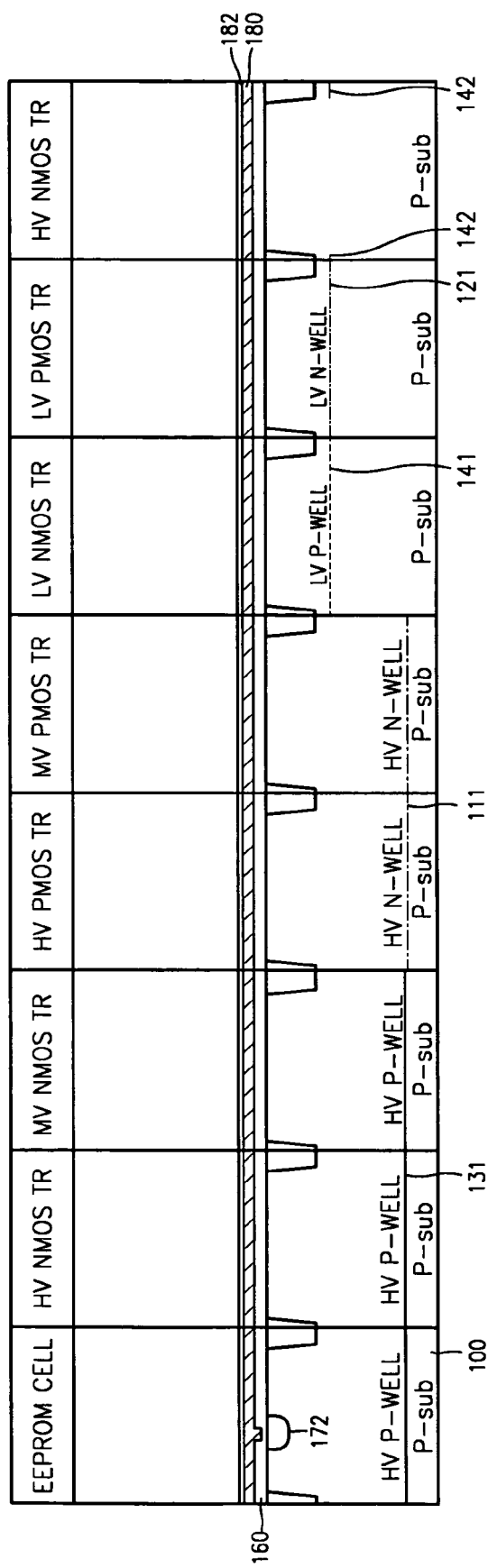

Referring to FIG. 21, the photoresist pattern 170 may be removed by ashing and using an organic strip, and then a photoresist pattern, which is not shown in FIG. 21, may be formed to define a tunnelling window. The gate oxide layer 160 exposed by the photoresist pattern may be wet etched and removed, and a tunnelling oxide layer 175 may be formed in the tunnelling window. The tunnelling oxide layer 175 may be formed to a thickness of 60 Å to 80 Å. A lower conductive layer 180 may be deposited to form a floating gate electrode of the transistor of the EEPROM cell and a gate electrode of the HV TR. The lower conductive layer 180 may be formed to a thickness of 1350 Å to 1650 Å. The lower conductive layer 180 may be formed of polysilicon using CVD, SACVD, LPCVD, or PECVD, and most preferably, LPCVD. After a polysilicon layer for the lower conductive layer 180 is formed by LPCVD using $N_2$ gas and $SiH_4$ gas, phosphorus ions may be deposited using $POCl_3$ gas to control resistance, or a doped polysilicon layer may be formed by LPCVD using $N_2$, $SiH_4$ (or $Si_2H_6$), or $PH_3$ gas. An anti-reflection layer (ARL) may be formed on the lower conductive layer 180, and then the lower conductive layer 180 may be patterned per cell. An inter-gate insulating layer 182 may be formed on the entire surface of the substrate 100. The inter-gate insulating layer 182 may be an ONO layer formed of an oxide layer that may be 30 Å to 70 Å thick, a nitride layer that may be 50 Å to 80 Å thick, and an oxide layer that may be 30 Å to 70 Å thick, which may be stacked sequentially.

Figure 22:
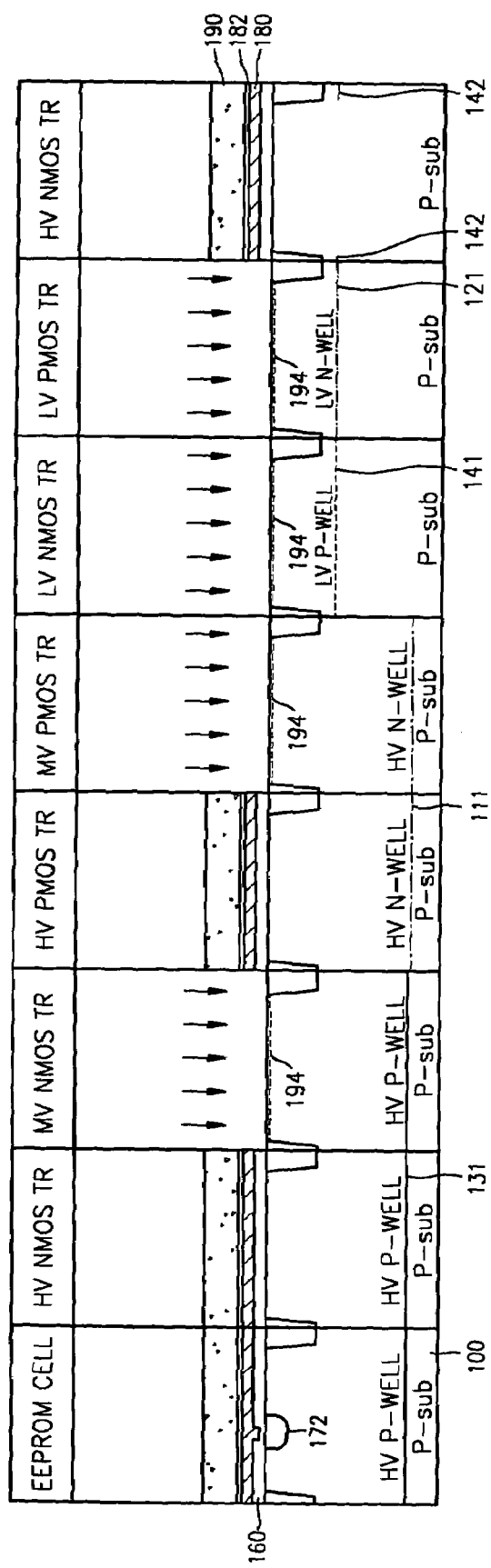

Referring to FIG. 22, a photoresist pattern 190 may be formed so as to expose a region where an LV TR and an MV TR may be formed. The inter-gate insulating layer 182, the lower conductive layer 180, and the gate oxide layer 160 may be sequentially etched by using the photoresist pattern 190 as an etch mask, which may expose the portion of the substrate 100 corresponding to the region where the LV TR and the MV TR may be formed. The inter-gate insulating layer 182 and the lower conductive layer 180 may be etched using a dry etch process, and the gate oxide layer 160 may be etched using a wet etch process. A $V_{TH}$ control region 194 may be formed by implanting boronic fluorine ($BF_2^+$) ions at a dose of $1\times10^{12}$ to $5\times10^{12}$ atoms/cm$^2$ and at an energy of 30 KeV.

Figure 23:
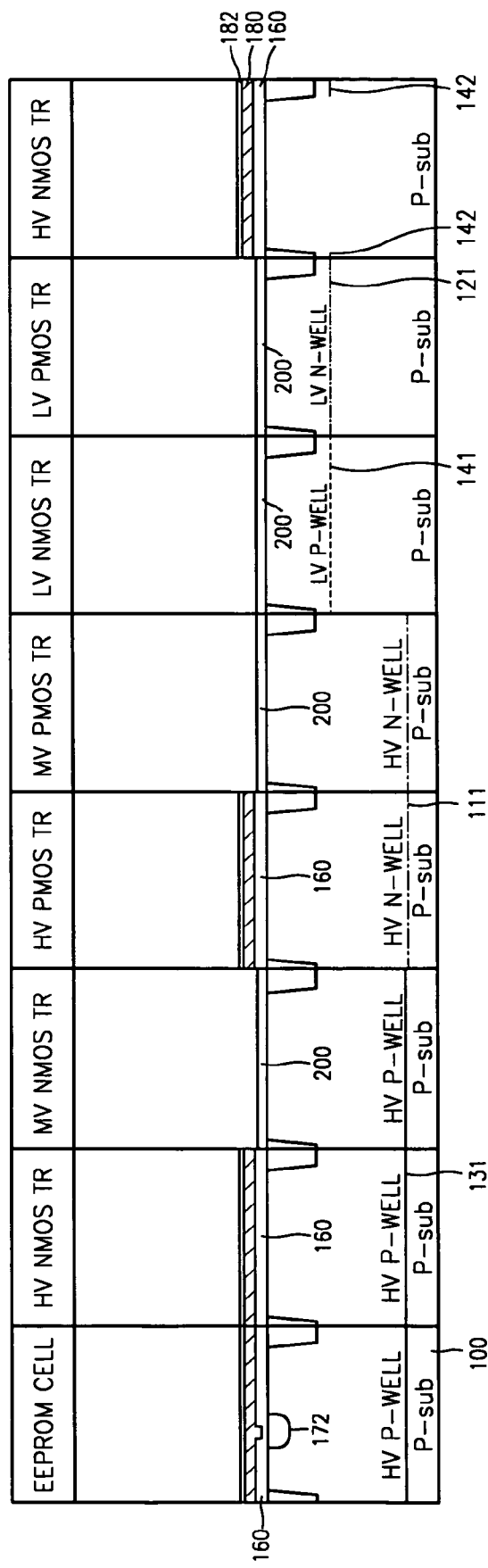

Referring to FIG. 23, the photoresist pattern 190 may be removed by ashing and using an organic strip, and a gate oxide layer 200 for the MV TR may be formed on the exposed substrate 100 at a thickness of 100 Å to 200 Å.

Figure 24:
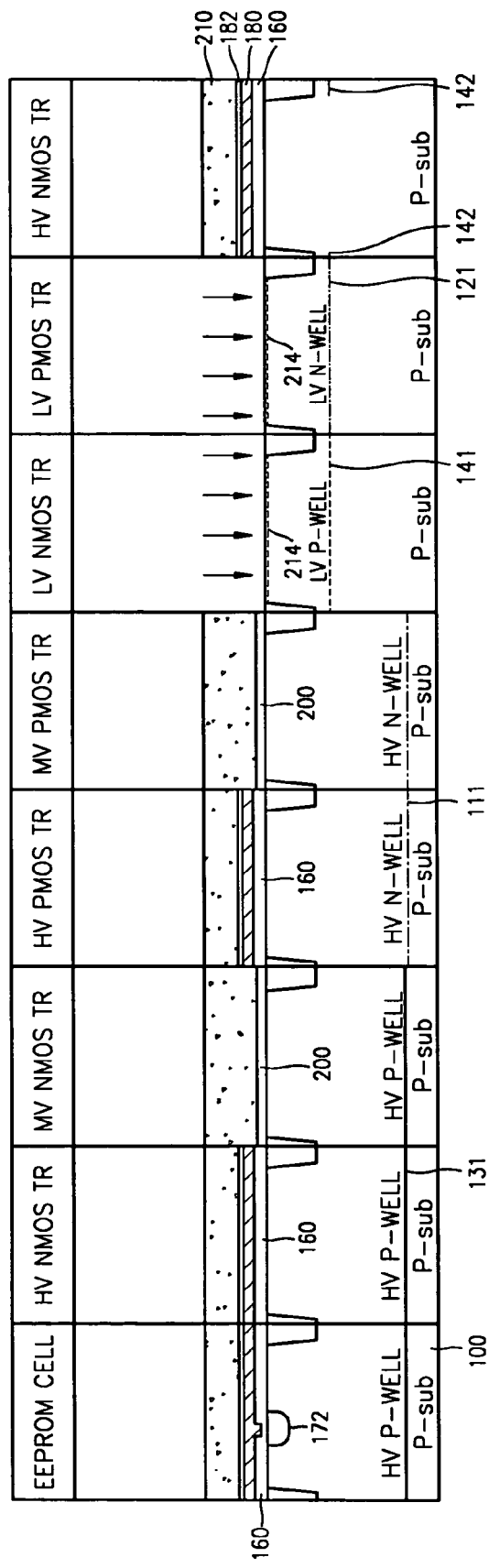

Referring to FIG. 24, a photoresist pattern 210 may be formed so as to expose a region where the LV TR will be formed. The gate oxide layer 200 of the MV TR may be etched using a wet etch process. The $V_{TH}$ control region 214 of the LV TR may be formed by using the photoresist pattern 210 as an ion implantation mask, boronic fluorine ($BF_2^+$) ions may be implanted at a dose of $1\times10^{12}$ to $5\times10^{12}$ atoms/cm$^2$ and at an energy of 30 KeV.

Figure 25:
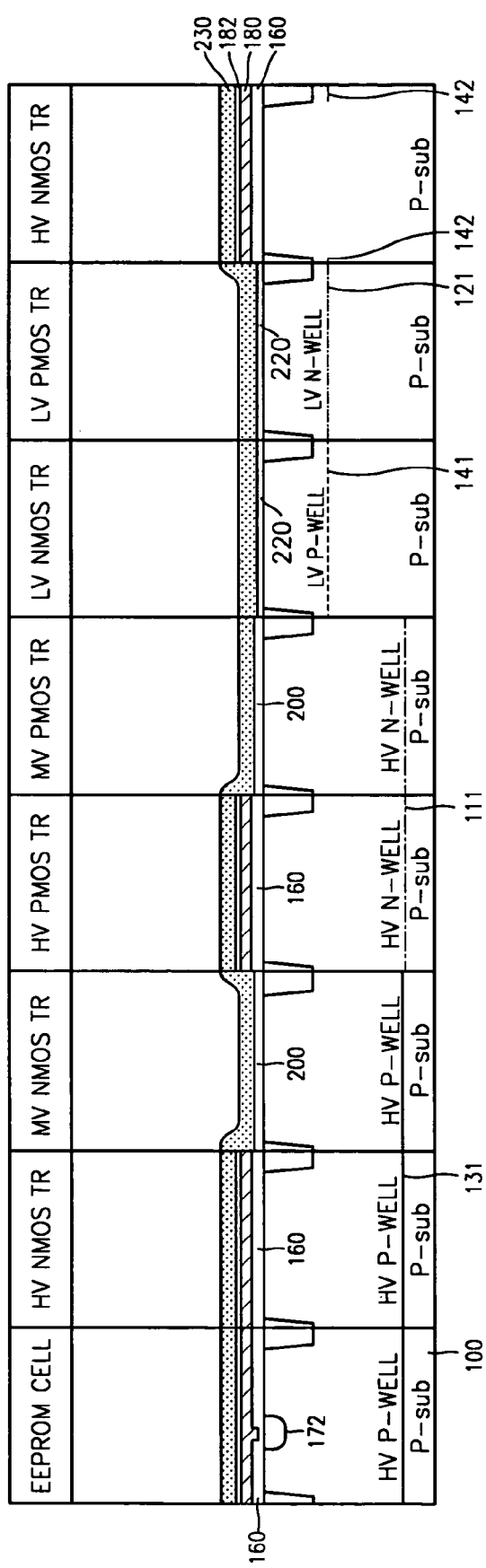

Referring to FIG. 25, the photoresist pattern 210 may be removed by ashing and using an organic strip, and a gate oxide layer 220 for the LV TR may be formed on the exposed substrate 100 at a thickness of 20 Å to 40 Å. An upper conductive layer 230 may be formed on the entire surface of the substrate 100 in order to form a control gate of the EEPROM cell TR, a pseudo gate of the HV TR, and gate electrodes of the LV TR and the MV TR. The upper conductive layer 230 may be formed of a polysilicon layer and a metal silicide layer, which may be stacked sequentially. After the polysilicon layer is formed, phosphorus ions may be deposited to control a resistance, forming a doped polysilicon layer. The metal silicide layer may be formed using a tungsten silicide layer on the polysilicon layer. The polysilicon layer may be formed at a thickness of 1350 Å to 1650 Å and the tungsten silicide layer may be formed at a thickness of 1000 Å by LPCVD using $SiH_2Cl_2$ gas and $WF_6$ gas.

Figure 26:
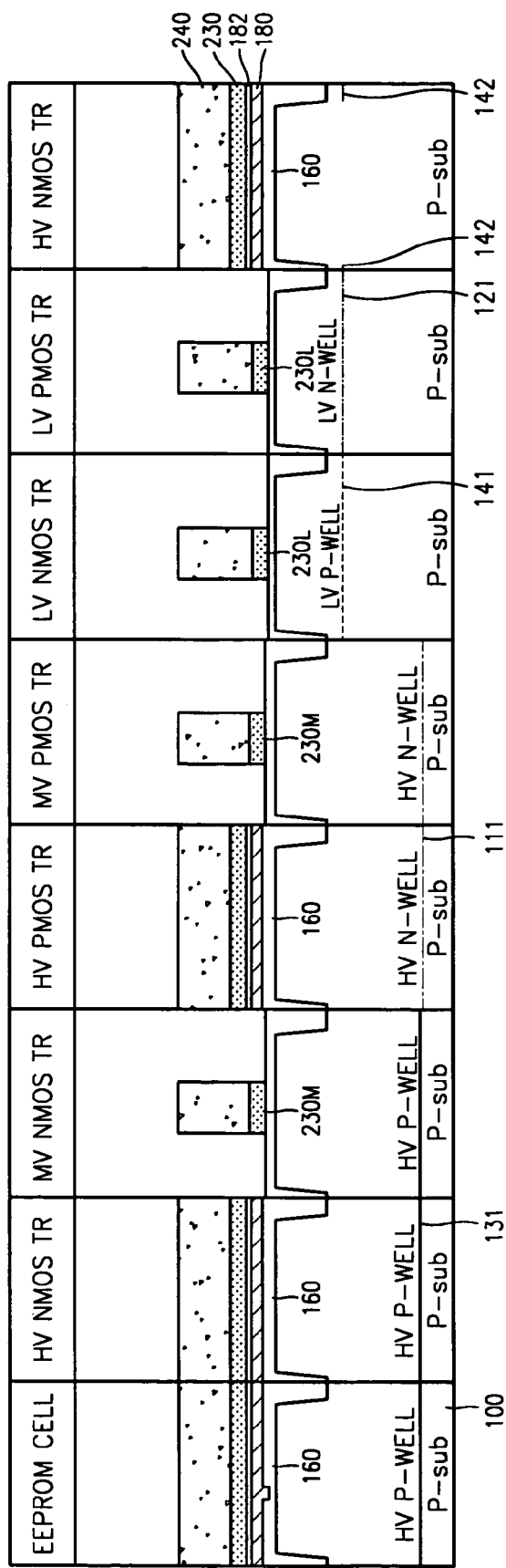

Referring to FIG. 26, a photoresist pattern 240 may be formed on the upper conductive layer 230 to define a gate structure. The upper conductive layer 230 may be etched by using the photoresist pattern 240 as a mask, which may form a gate 230L of the LV TR and a gate 230M of the MV TR.

Figure 27:
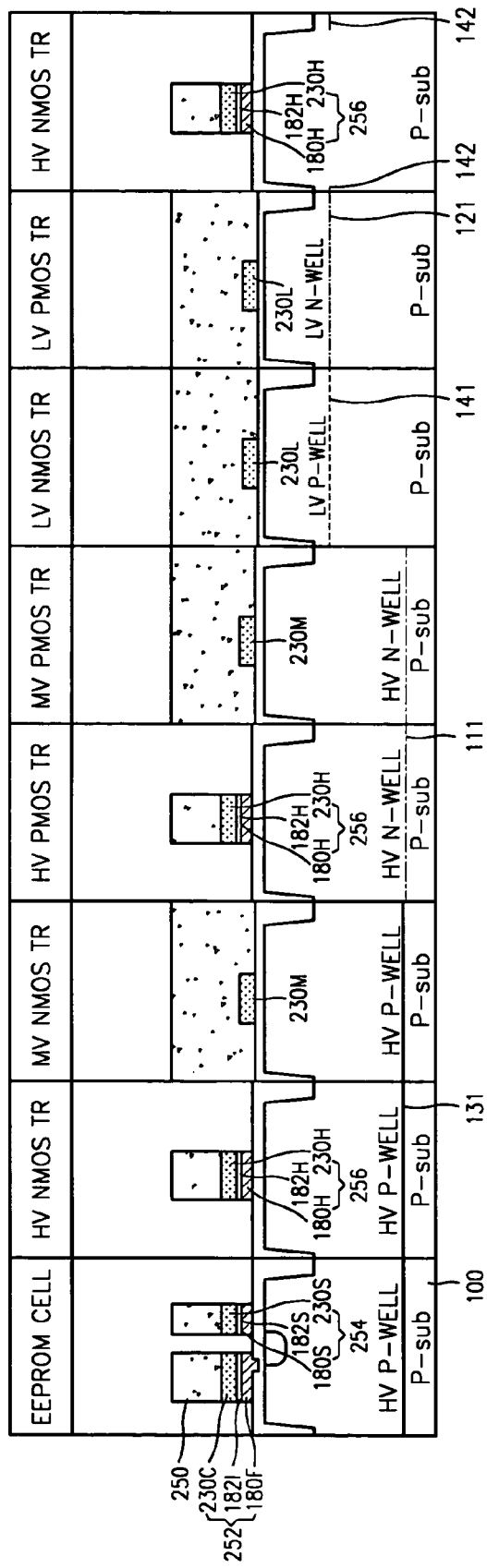

Referring to FIG. 27, the photoresist pattern 240 may be removed by ashing and using an organic strip, and a photoresist pattern 250 may be formed which may define a gate structure of the transistor of the EEPROM cell and a gate structure of the HV TR. The upper conductive layer 230, the inter-gate insulating layer 182, and the lower conductive layer 180 may be sequentially etched by self-alignment using the photoresist pattern 250 as an etch mask, which may complete a gate structure 252 of the memory transistor MTR of the EEPROM, a pseudo gate structure 254 of the selection transistor STR, and a gate structure 256 of the HV TR.

Figure 28:
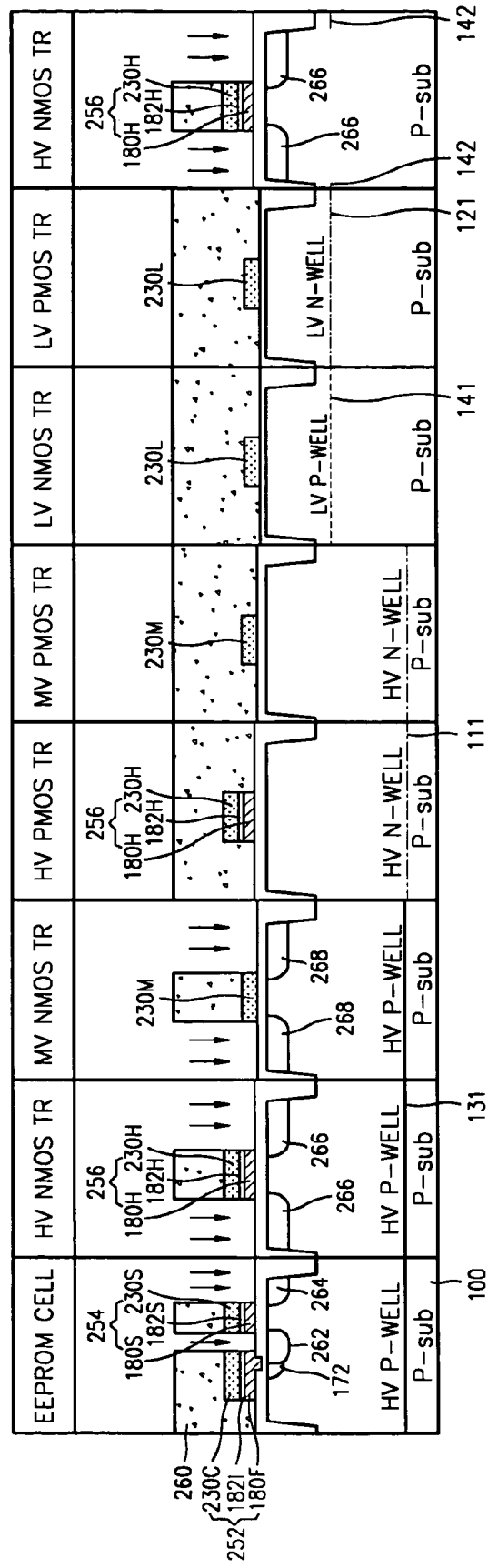

Referring to FIG. 28, the photoresist pattern 250 may be removed by ashing and using an organic strip, and a photoresist pattern 260 may be formed to define an $n^-$-type region. N-type impurity ions may be implanted by using the photoresist pattern 260 as an ion implantation mask. Phosphorus ($p^+$) ions may be implanted at a dose of $5\times10^{12}$ to $9\times10^{12}$ atoms/cm$^2$ and at an energy of 90 KeV, which may form an $n^-$-type region 262 as the floating junction region, an $n^-$-type region 264 as the drain region in the EEPROM cell TR, an $n^-$-type region 266 of the HV NMOS TR, and an $n^-$-type region 268 of the MV NMOS TR.

Figure 29:
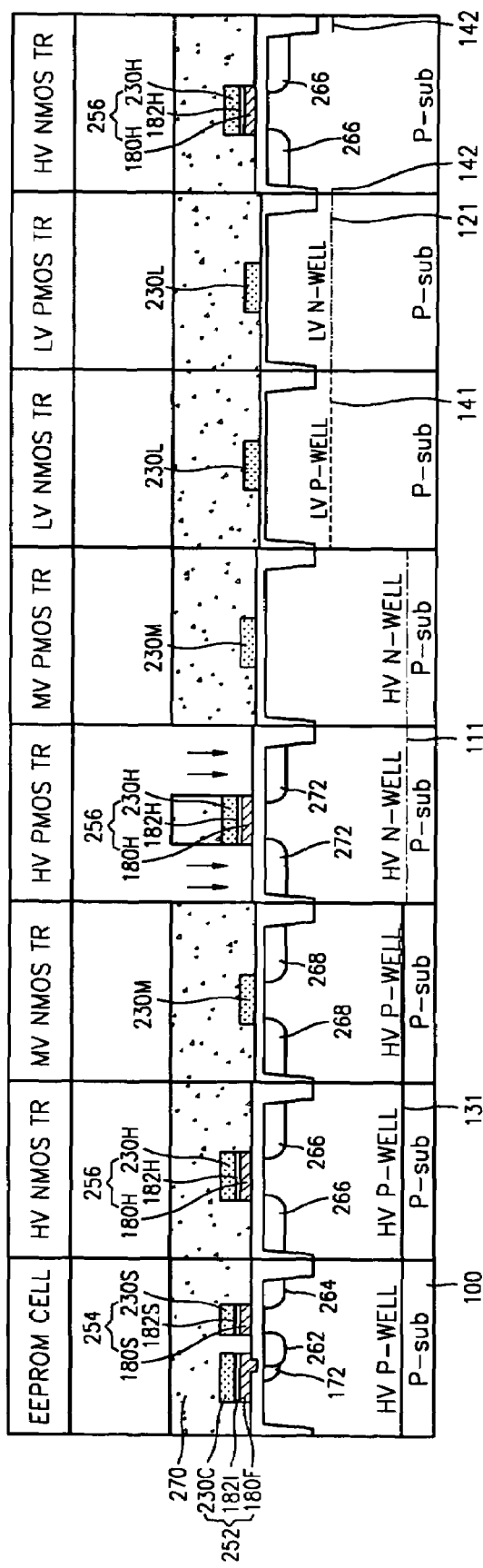

Referring to FIG. 29, the photoresist pattern 260 may be removed by ashing and using an organic strip, and a photoresist pattern 270 may be formed to define a $p^-$-type region. P-type impurity ions may be implanted by using the photoresist pattern 270 as an ion implantation mask. Boron ($B^+$) ions may be implanted at a dose of $1\times10^{12}$ to $9\times10^{12}$ atoms/cm² and at an energy of 50 KeV, which may form a p⁻-type region 272 of the HV PMOS TR.

Figure 30:
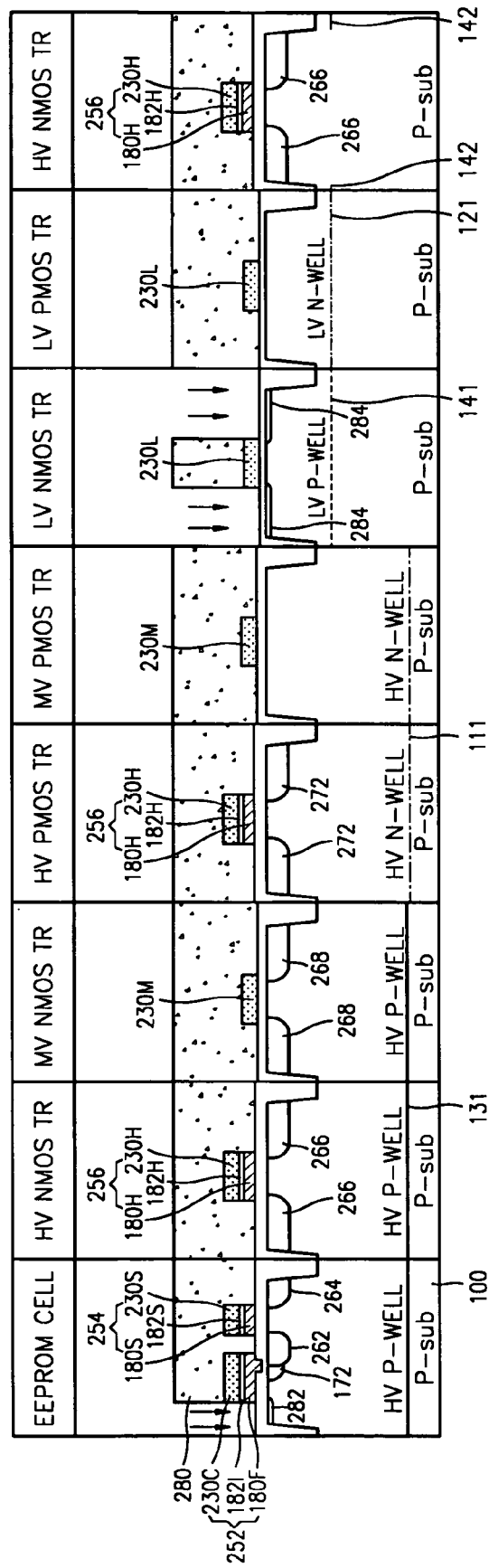

Referring to FIG. 30, the photoresist pattern 270 may be removed by ashing and using an organic strip, and a photoresist pattern 280 may be formed to define an LDD n⁻-type region. N-type impurity ions may be implanted by using the photoresist pattern 280 as an ion implantation mask. Arsenic (As⁺) ions may be implanted at a dose of $1 \times 10^{14}$ to $8 \times 10^{14}$ atoms/cm² and at an energy of 25 KeV, which may form an n⁻-type region 282 as a source region in the transistor of the EEPROM cell and an n⁻-type region 284 as the LV NMOS TR.

Figure 31:
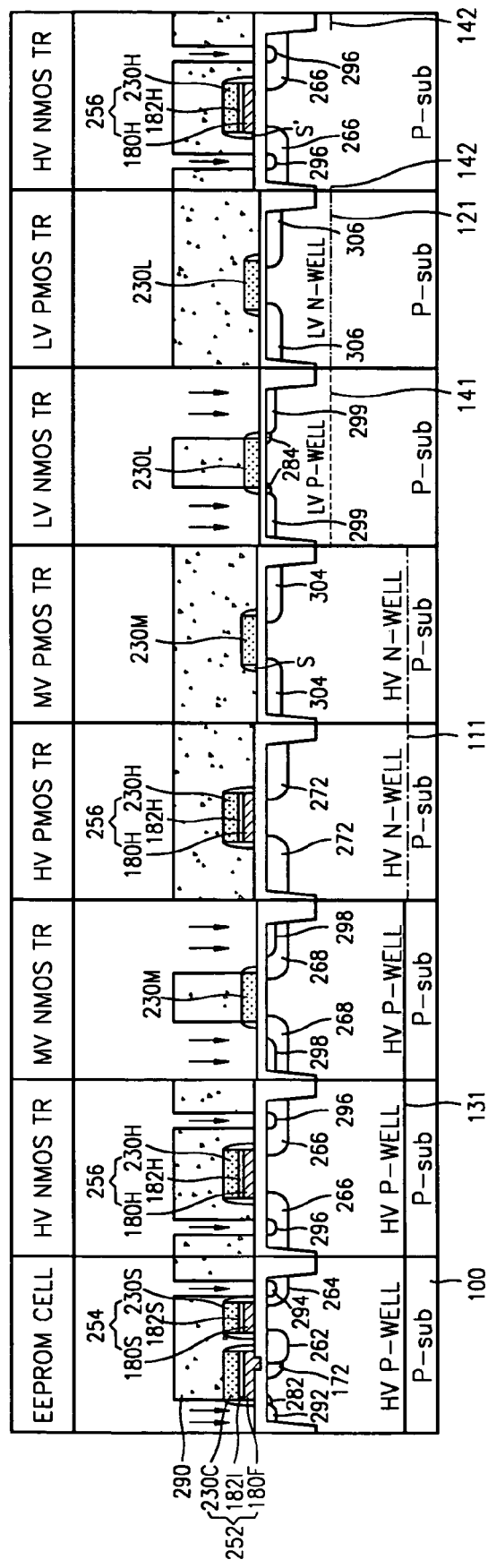

Referring to FIG. 31, spacers S' may be formed on the sidewalls of the gate. A nitride layer may be deposited on the entire surface of the substrate and then dry etched to form the spacers, a. A photoresist pattern 290 may be formed to define an n⁺-type region. N-type impurity ions may be implanted by using the photoresist pattern 290 as an ion implantation mask. Arsenic (As⁺) ions may be implanted at a dose of $1 \times 10^{15}$ to $5 \times 10^{15}$ atoms/cm² and at an energy of 50 KeV, which may form an n⁺-type region 292 as a source region and an n⁺-type region 294 as a drain region in the EEPROM cell TR, an n⁺-type region 296 of the HV NMOS TR, an n⁺-type region 298 of the MV NMOS TR, and an n⁺-type region 299 of the LV NMOS TR.

Figure 32:
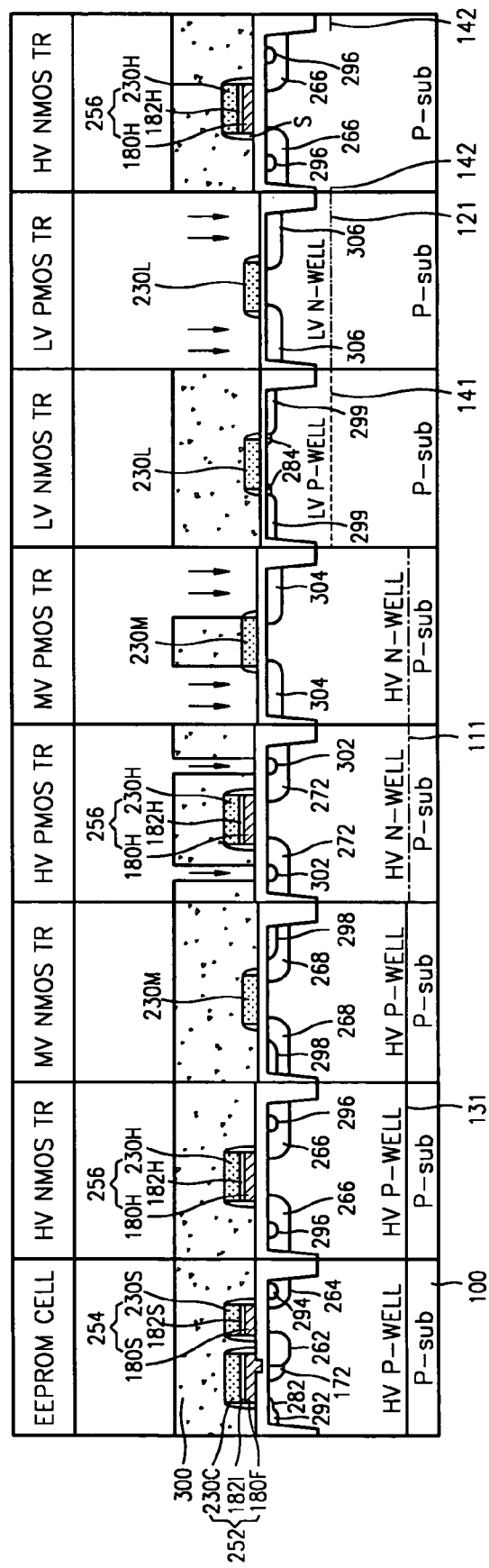

Referring to FIG. 32, the photoresist pattern 290 may be removed by ashing and using an organic strip, and a photoresist pattern 300 may be formed to define a p⁺-type region. P-type impurity ions may be implanted by using the photoresist pattern 300 as an ion implantation mask. Boronic fluorine ($BF_2^+$) ions may be implanted at a dose of $1 \times 10^{15}$ to $5 \times 10^{15}$ atoms/cm² and at an energy of 20 KeV, which may form a p⁺-type region 302 of the HV PMOS TR, a p⁺-type region 304 of the MV PMOS TR, and a p⁺-type region 306 of the LV PMOS TR.

Figure 33:
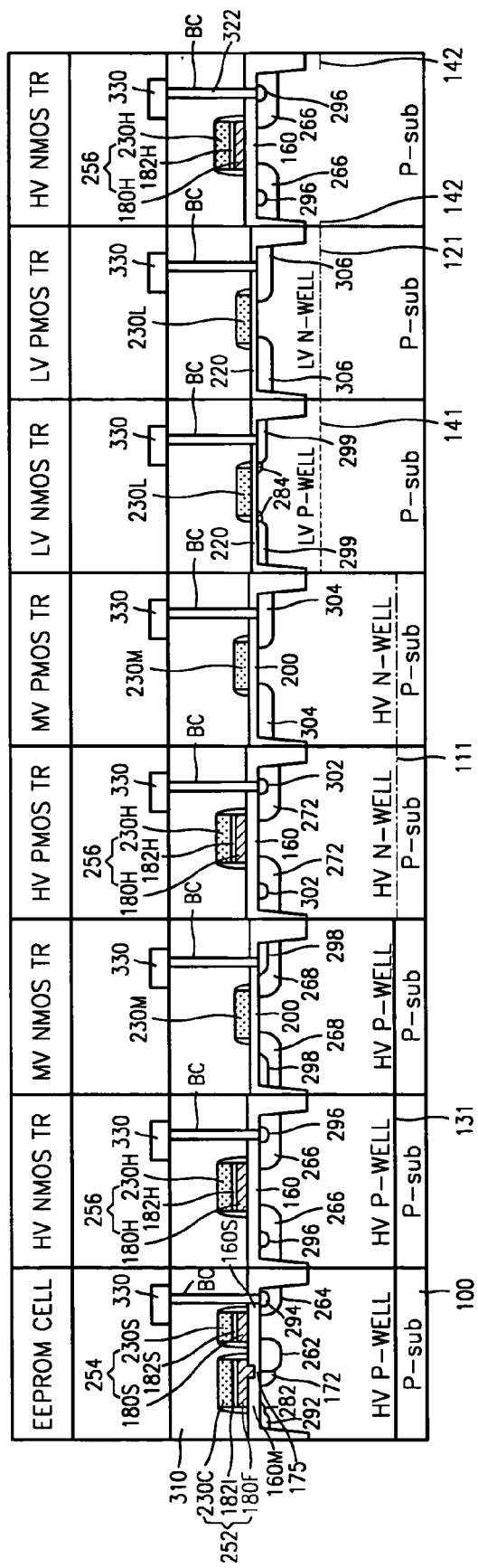

Referring to FIG. 33, an interlayer dielectric (ILD) 310 may be formed on the entire surface of the substrate 100. A SiON layer, an HDP oxide layer, and a TEOS layer may be sequentially formed using CVD and then planarized using CMP, which may form the ILD 310. The ILD 310 may be formed to a thickness of 8100 Å to 9900 Å. Contact holes BC may be formed to expose the drain regions of the transistors and then impurity ions may be implanted so as to form bit line contact plugs 322. The bit line contact plugs 322 may be formed by sequentially forming a barrier metal layer and a tungsten layer using CVD and then planarized using CMP. A metal layer may be formed and then patterned, which may form bit lines 330. The metal layer may be formed by sequentially stacking a titanium layer, an aluminium layer, and a titanium nitride layer.

In an exemplary embodiment, known CMOS manufacturing processes may be implemented in order to complete the single chip data processing device describe above.

In an exemplary embodiment of the present invention the single chip data processing device may comprise transistors of various voltage ranges which enable effective data storage, data reading, and data processing. Further, the single chip data processing device may be highly integrated and effectively scaled down while retaining the unique characteristics of nonvolatile memory devices.

In an exemplary embodiment of the present invention the single chip data processing device may comprise a plurality of wells for isolating transistors of a plurality of voltage ranges, wherein each one of the plurality of wells contains at least one transistor of a particular voltage range and wherein transistors of only one of the plurality of voltage ranges are within each of the plurality of wells. The at least one transistor may be a high-voltage transistor, intermediate-voltage transistor, or a low-voltage transistor.

In an exemplary embodiment the present invention provides a method of isolating transistors of a first voltage range from transistors of a another voltage range, comprising a first well to hold transistors only of a first particular voltage range and forming a second well to hold transistors only of a second particular voltage range.

The exemplary embodiments of the present invention being thus described, it will be obvious that the same may be varied in many ways. For example, the voltage ranges of the high-voltage transistor, intermediate-voltage transistor, and low-voltage transistors may be different than those specifically discussed in view of the exemplary embodiments.

Further, the order of formation of the respective wells is not limited to the exemplary embodiment of the present invention described and various changes may be made by one skilled in the art thereto.

Further, the voltage ranges of the high-voltage transistor, intermediate-voltage transistor, and low-voltage transistors may overlap. For example, if a high-voltage transistor is 14–20 volts, and an intermediate transistor is 5–15 volts, a transistor of 14 volts may be contained in a well for either high-voltage transistors and/or intermediate-voltage transistors.

Further, more than one well for containing transistors of a particular voltage range may be formed. For example, a first well may contain low-voltage transistors, and a second well may also contain low-voltage transistors.

Such variations are not to be regarded as departure from the spirit and scope of the exemplary embodiments of the present invention, and all such modifications as would be obvious to one skilled in the art are intended to be included within the scope of the following claims.

What is claimed is:

1. A device comprising:
 a first well formed in a substrate of a first conductivity type having a first dopant concentration, wherein the first well is of the first conductivity type;
 a second well of the first conductivity type formed in the substrate and being deeper than the first well, the second well having a higher dopant concentration than the first dopant. concentration: and
 a nonvolatile memory cell formed on the second well, wherein
 the nonvolatile memory cell is an EEPROM cell, and the EEPROM cell comprises a memory transistor and a selection transistor,
 wherein the memory transistor includes:
 a tunneling oxide layer;
 a gate oxide layer formed on the tunneling oxide layer to be thicker than the tunneling oxide layer;
 a stack gate formed on the tunneling oxide layer and the gate oxide layer of the memory transistor, the stack gate formed of a floating gate, an inter-gate insulating layer, and a control gate;
 a source region formed within the second well to be aligned with one sidewall of the stack gate; and
 a floating junction region formed within the second well to be aligned with the other sidewall of the stack gate, the floating junction region formed disposed under the tunneling oxide layer and the gate oxide layer of the memory transistor,
 and wherein the selection transistor includes:
 a gate oxide layer;

a gate formed on the gate oxide layer of the selection transistor parallel to the stack gate of the memory transistor;

the floating junction region aligned with a sidewall of the gate facing the other sidewall of the stack gate of the memory transistor; and a drain region formed within the second well to be aligned with the other sidewall of the gate.

2. The device of claim 1, further comprising an insulating pattern and a pseudo gate formed on the gate of the selection transistor, the insulating pattern being formed at the same time as the inter-gate insulating layer, and the pseudo gate being formed at the same time as the control gate, wherein the gate and the pseudo gate are connected to the same upper interconnection.

3. A device comprising:

a first well formed in a substrate of a first conductivity type having a first dopant concentration, wherein the first well is of the first conductivity type;

a second well of the first conductivity type formed in the substrate and being deeper than the first well, the second well having a higher dopant concentration than the first dopant concentration;

a nonvolatile memory cell formed on the second well; and a transistor formed on the second well, wherein
the transistor is a high-voltage transistor, and the same voltage is applied to the the high-voltage transistor as is applied to the nonvolatile memory cell.

4. A device comprising:

a first well formed in a substrate of a first conductivity type having a first dopant concentration, wherein the first well is of the first conductivity type;

a second well of the first conductivity type formed in the substrate and being deeper than the first well, the second well having a higher dopant concentration than the first dopant concentration;

a nonvolatile memory cell formed on the second well; and a transistor formed on the first well, wherein
the transistor is a low-voltage transistor, and a lower voltage is applied to the low-voltage transistor than is applied to the nonvolatile memory cell.

5. The device of claim 4, further comprising a transistor formed on the second well.

6. The device of claim 5 wherein the transistor formed on the second well is an intermediate-voltage transistor.

7. The device of claim 6 wherein an intermediate voltage between the voltages applied to the nonvolatile memory cell and the low-voltage transistor is applied to the intermediate-voltage transistor.

8. The device of claim 6, wherein the intermediate-voltage transistor comprises:

a gate oxide layer formed on the second well;

a gate formed on the gate oxide layer;

a DDD-type source region formed within the second well to be aligned with a sidewall of the gate; and a DDD-type drain region formed within the second well to be aligned with the other sidewall of the gate.

9. A device comprising:

a first well formed in a substrate of a first conductivity type having a first dopant concentration, wherein the first well is of the first conductivity type;

a second well of the first conductivity type formed in the substrate and being deeper than the first well, the second well having a higher dopant concentration than the first dopant concentration;

a nonvolatile memory cell formed on the second well: and a third well formed in the substrate, the third well being deeper than the first well and of an opposite conductivity type to the second well.

10. The device of claim 9, further comprising:

a high-voltage transistor formed on the third well.

11. The device of 10, wherein the same voltage is applied to the high-voltage transistor as is applied to the nonvolatile memory cell.

12. The device of claim 10, wherein a shallow trench isolation region which defines an active region is formed at the substrate, wherein the shallow trench isolation region comprises:

a trench formed in the substrate;

an oxide layer formed along a sidewall of the trench;

a nitride layer conformably formed on the oxide layer; and a planarized insulating layer filling the trench, wherein the oxide layer has a thickness such that the oxide layer prevents trapping of electrons in the nitride layer when a high voltage is applied to the high-voltage transistor formed on the third well.

13. The device of claim 10, wherein the high-voltage transistor formed on the third well comprises:

a gate oxide layer;

a gate formed on the gate oxide layer;

a mask-island-DDD-type source region formed within the third well to be aligned with a sidewall of the gate; and a mask-island-DDD-type drain region formed within the third well to be aligned with the other sidewall of the gate.

14. The device of claim 13, further comprising an insulating pattern and a pseudo gate formed on the gate of the high-voltage transistor, wherein the gate of the high-voltage transistor and the pseudo gate are connected to the same upper interconnection.

15. A device comprising:

a first well formed in a substrate of a first conductivity type having a first dopant concentration, wherein the first well is of the first conductivity type;

a second well of the first conductivity type formed in the substrate and being deeper than the first well, the second well having a higher dopant concentration than the first dopant concentration;

a nonvolatile memory cell formed on the second well; and a transistor formed on the first well, wherein
the transistor is a low-voltage transistor, and a third well is formed in the substrate, the third well being deeper than the first well and of an opposite conductivity type to the second well.

16. The device of claim 15 further comprising:

an intermediate-voltage transistor formed on the third well, wherein an intermediate voltage between the voltages applied to the nonvolatile memory cell and the low-voltage transistor is applied to the intermediate-voltage transistor.

17. A device comprising:

a first well formed in a substrate of a first conductivity type having a first dopant concentration, wherein the first well is of the first conductivity type;

a second well of the first conductivity type formed in the substrate and being deeper than the first well, the second well having a higher dopant concentration than the first dopant concentration;

a nonvolatile memory cell formed on the second well; and a transistor formed on the substrate; and wherein the doping profile of the first well is identical to that of a field isolation region of the transistor.

18. A device, comprising:
a substrate of a first conductivity type with a first dopant concentration;
a first well of the first conductivity type formed in the substrate;
a second well formed in the substrate deeper than the first well and with a higher dopant concentration than the first dopant concentration;
a third well of a second conductivity type that is opposite to the first conductivity type;
a fourth well of the second conductivity type formed in the substrate and being shallower than the third well; and
a nonvolatile memory cell formed on the second well.

19. The device of claim 18, wherein the nonvolatile memory cell is an EEPROM cell.

20. The device of claim 19, wherein the EEPROM cell comprises a memory transistor and a selection transistor,
wherein the memory transistor includes:
a tunneling oxide layer;
a gate oxide layer formed on the tunneling oxide layer to be thicker than the tunneling oxide layer;
a stack gate formed on the tunneling oxide layer and the gate oxide layer of the memory transistor, the stack gate formed of a floating gate, an inter-gate insulating layer, and a control gate;
a source region of a second conductivity type formed within the second well to be aligned with a sidewall of the stack gate; and
a floating junction region of the second conductivity type formed within the second well to be aligned with the other sidewall of the stack gate, the floating junction region formed under the tunneling oxide layer and the gate oxide layer of the memory transistor,
and wherein the selection transistor includes:
a gate oxide layer;
a gate formed on the gate oxide layer of the selection transistor parallel to the stack gate of the memory transistor;
the floating junction region aligned with a sidewall of the gate facing the other sidewall of the stack gate of the memory transistor; and
a drain region of the second conductivity type formed within the second well to be aligned with the other sidewall of the gate.

21. The device of claim 20, further comprising an insulating pattern and a pseudo gate formed on the gate of the selection transistor, the insulating pattern being formed at the same time as the inter-gate insulating layer, and the pseudo gate being formed at the same time as the control gate,
wherein the gate and the pseudo gate are connected to the same upper interconnection.

22. The device of claim 18, further comprising a first transistor to which a first voltage is applied formed on the first well;
a second transistor to which a second voltage is applied formed on the second well;
a third transistor to which the second voltage is applied formed on the third well; and
a fourth transistor to which the first voltage is applied formed on the fourth well,
wherein the second voltage is higher than the first voltage.

23. The device of claim 22, wherein gate oxide layers of the second transistor and the third transistor are thicker than gate oxide layers of the first transistor and the fourth transistor.

24. The device of claim 22, wherein the gate oxide layer of the EEPROM cell is as thick as each of the gate oxide layers of the second transistor and the third transistor, and the gate oxide layers of the second transistor and the third transistor are thicker than the gate oxide layers of the first transistor and the fourth transistor.

25. The device of claim 22, wherein a shallow trench isolation region which defines an active region is formed at a substrate,
wherein the shallow trench isolation region comprises:
a trench formed in the substrate;
an oxide layer formed along a sidewall of the trench;
a nitride layer conformably formed on the oxide layer; and
a planarized insulating layer filling the trench,
wherein the oxide layer is formed to a thickness such that the oxide layer prevents trapping of electrons in the nitride layer when the second voltage is applied to the third transistor of the second voltage formed on the third well.

26. The device of claim 22, wherein the third transistor comprises:
a gate oxide layer;
a gate formed on the gate oxide layer of the third transistor;
a mask-island-DDD-type source region of the first conductivity type formed within the third well to be aligned with a sidewall of the gate; and
a mask-island-DDD-type drain region of the first conductivity type formed within the third well to be aligned with the other sidewall of the gate.

27. The device of claim 22, wherein the second transistor comprises:
a gate oxide layer formed on the second well;
a gate formed on the gate oxide layer of the second transistor;
a mask-island-DDD-type source region of the second conductivity type formed within the second well to be aligned with a sidewall of the gate; and
a mask-island-DDD-type drain region of the second conductivity type formed within the second well to be aligned with the other sidewall of the gate.

28. The device of claim 22, wherein the first transistor comprises:
a gate oxide layer formed on the first well;
a gate formed on the gate oxide layer of the first well;
a DDD-type source region of the second conductivity formed within the first well to be aligned with a sidewall of the gate; and
a DDD-type drain region of the second conductivity formed within the first well to be aligned with the other sidewall of the gate,
and wherein the fourth transistor comprises:
a gate oxide layer formed on the fourth well;
a gate formed on the gate oxide layer of the fourth well;
a source region of the first conductivity type formed within the fourth well to be aligned with a sidewall of the gate; and
a drain region of the first conductivity type formed within the fourth well to be aligned with the other sidewall of the gate.

29. The device of claim 18, further comprising:
a first transistor to which a first voltage is applied formed on the first well;
a second transistor to which a second voltage is applied formed on the second well;

a third transistor to which a third voltage is applied formed on the second well;

a fourth transistor to which the second voltage is applied formed on the third well;

a fifth transistor to which the third voltage is applied formed on the third well, and a sixth transistor to which the first voltage is applied formed on the fourth well; and wherein the third voltage is higher than the second voltage, and the second voltage is higher than the first voltage.

30. The device of claim 29, wherein gate oxide layers of the third transistor and the fifth transistor are thicker than gate oxide layers of second transistor and the fourth transistor, and wherein the gate oxide layers of the second transistor and the fourth transistor are thicker than gate oxide layers of the first transistor and the sixth transistor.

31. The device of claim 29, wherein the gate oxide layer of the EEPROM cell is as thick as each of the gate oxide layers of the third transistor and the fifth transistor, wherein the gate oxide layers of the third transistor and the fifth transistor are thicker than the gate oxide layers of the second transistor and the fourth transistor, and wherein the gate oxide layers of the second transistor and the fourth transistor are thicker than the gate oxide layers of the first transistor and the sixth transistor.

32. The device of claim 29, wherein the second transistor comprises:

a gate oxide layer formed on the second well;

a gate formed on the gate oxide layer of the second transistor;

a DDD-type source region of the second conductivity type formed within the second well to be aligned with a sidewall of the gate; and a DDD-type drain region of the second conductivity type formed within the second well to be aligned with the other sidewall of the gate.

33. The device of claim 18, further comprising:

a first transistor to which a first voltage is applied formed on the first well;

a second transistor to which a second voltage is applied formed on the second well;

a third transistor to which a third voltage is applied formed on the second well;

a fourth transistor to which the second voltage is applied formed on the third well;

a fifth transistor to which the third voltage is applied formed on the third well;

a sixth transistor to which the first voltage is applied formed on the fourth well; and a second third transistor to which the third voltage is applied formed on the substrate; and wherein the third voltage is higher than the second voltage, and the second voltage is higher than the first voltage.

34. The device of claim 33, wherein gate oxide layers of the third transistor and the fifth transistor are thicker than gate oxide layers of the second transistor and the fourth transistor.

35. The of claim 34, wherein the gate oxide layers of the second transistor and the fourth transistor are thicker than gate oxide layers of the first transistor and the sixth transistor.

36. The device of claim 34, wherein the gate oxide layer of the EEPROM cell is as thick as each of the gate oxide layers of the third transistor and the fifth transistor;

wherein the gate oxide layers of the third transistor and the fifth transistor are thicker than the gate oxide layers of the second transistor and the fourth transistor; and wherein the gate oxide layers of the second transistor and the fourth transistor are thicker than the gate oxide layers of the first transistor and the sixth transistor.

37. The device of claim 34, wherein the doping profile of the first well is identical to that of a field isolation region of the third transistor.

* * * * *